(12) United States Patent
Kinoshita et al.

(10) Patent No.: US 7,049,675 B2
(45) Date of Patent: May 23, 2006

(54) HIGH WITHSTAND VOLTAGE SEMICONDUCTOR DEVICE

(75) Inventors: Kozo Kinoshita, Kanagawa-ken (JP); Tetsuo Hatakeyama, Kanagawa-ken (JP); Takashi Shinohe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 10/795,270

(22) Filed: Mar. 9, 2004

(65) Prior Publication Data

US 2004/0173820 A1    Sep. 9, 2004

Related U.S. Application Data

(62) Division of application No. 10/196,448, filed on Jul. 17, 2002, now Pat. No. 6,831,345.

(30) Foreign Application Priority Data

Jul. 17, 2001   (JP) ............................ 2001-216668
Feb. 26, 2002   (JP) ............................ 2002-49076

(51) Int. Cl.
   *H01L 23/58*   (2006.01)

(52) U.S. Cl. ...................... 257/492; 257/170; 257/173; 257/493; 257/495

(58) Field of Classification Search ............... 257/492, 257/493, 495, 170, 173

See application file for complete search history.

(56) References Cited

U.S. PATENT DOCUMENTS 5,969,400 A * 10/1999 Shinohe et al. .............. 257/492

FOREIGN PATENT DOCUMENTS

| JP | 2-186675 | 7/1990 |
| JP | 3-147331 | 6/1991 |
| JP | 8-306937 | 11/1996 |
| JP | 10-200090 | 7/1998 |

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

A high withstand voltage semiconductor device does not show any significant fall of its withstand voltage if the impurity concentration of the RESURF layer of a low impurity concentration semiconductor region thereof varies from the optimal level and/or influenced by the fixed electric charge. The device is produced by forming a ring-shaped high impurity concentration edge termination layer of a second conductivity type and a ring-shaped low impurity concentration RESURF layer of the second conductivity type on the front surface of a semiconductor layer of a first conductivity type carrying electrodes respectively on the opposite surfaces thereof along the outer edge of one of the electrodes, then forming an outer ring layer with an impurity concentration substantially as low as the RESURF layer concentrically outside the RESURF layer with a gap separating therebetween and subsequently forming an inner ring layer with an impurity concentration substantially as high as the edge termination layer concentrically inside the RESURF layer.

14 Claims, 13 Drawing Sheets

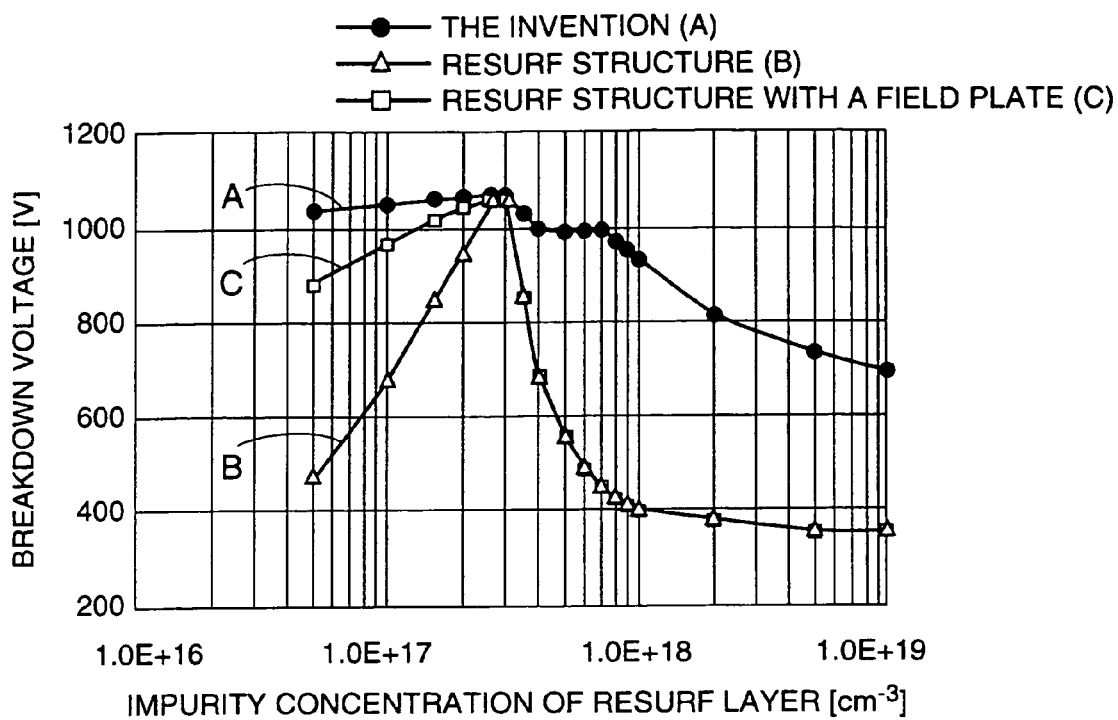
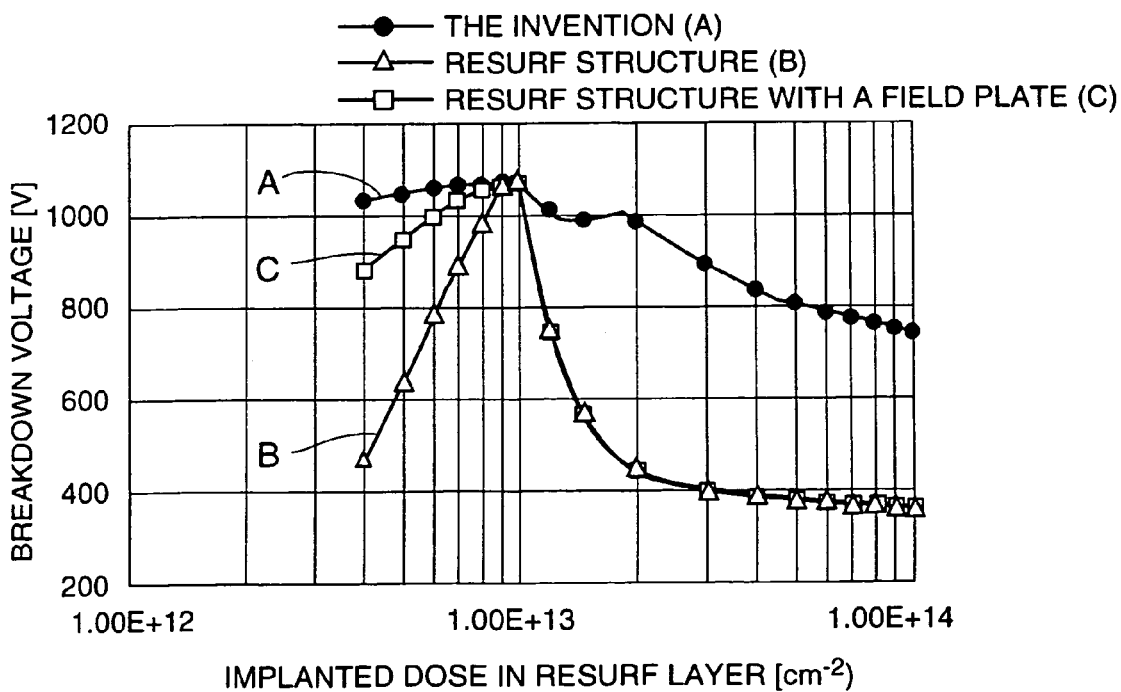

HIGH WITHSTAND VOLTAGE SEMICONDUCTOR DEVICE

CROSS-REFERENCE TO RELATED APPLICATIONS

This application is a division of and claims the benefit of priority under 35 USC §120 from U.S. Ser. No. 10/196,448, filed Jul. 17, 2002 now U.S. Pat. No. 6,831,345, and is based upon and claims the benefit of priority under 35 USC §119 from Japanese Patent Application No. 2001-216668, filed Jul. 17, 2001 and P2002-49076, filed on Feb. 26, 2002; the entire contents of which are incorporated herein by reference.

BACKGROUND OF THE INVENTION

1. Field of the Invention

This invention relates to a high withstand voltage semiconductor device.

2. Description of the Related Art

PN junction diodes, Schottky barrier diodes, MOSFETs and IGBTs are among high withstand voltage devices that can operate as switching or amplifying elements for power applications. Known withstand voltage structures of such devices include field plate structures, guard ring structures and RESURF (reduced surface field) structures. These structures will be briefly described below in terms of the structure of a Schottky barrier diode.

A high withstand voltage semiconductor device is typically formed by arranging a Schottky junction electrode at the center of the front surface of an n– first conductivity type substrate with a low impurity concentration and forming an opposing electrode, utilizing the rear surface of the substrate as n+ layer. Then, a withstand voltage structure is arranged to surround the Schottky junction electrode so as to eliminate possible appearance of an intensified electric field from the outer periphery of the Schottky junction electrode. When a reverse bias voltage is applied between the electrodes, the depletion layer expands from an area immediately surrounding the junction electrode on the substrate surface toward the inside of the substrate, although it can hardly expand toward the outer periphery of the substrate surface due to the influence of the fixed charge in the oxide film and other factors so that the electric field is locally intensified to give rise to a breakdown of the junction. Therefore, a high withstand voltage device is realized by using a withstanding structure that is adapted to expand the depletion layer toward the terminal outer periphery of the substrate in a well balanced manner.

FIG. 20 of the accompanying drawings is a schematic cross sectional view of a field plate structure. It shows a Schottky barrier diode comprising a Schottky junction electrode 102 and an opposing electrode 103 arranged respectively on the front surface and the rear surface of an n– type substrate 101. An edge termination layer 104 of a p+ well is arranged along the outer edge of the Schottky junction electrode 102, while an n+ channel stopper layer 105 is arranged along the outermost peripheral edge of the substrate. The region of the substrate between these layers is a terminating region. The surface of the substrate is coated with an oxide film 106 between the Schottky junction electrode 102 and the channel stopper layer 105. A color-shaped metal field plate 107 is arranged on the oxide film 106 over an area extending from the Schottky junction electrode 102 to the outer periphery.

As a reverse bias voltage is applied to the opposing electrode 103 and the channel stopper layer 105 relative to the Schottky junction electrode 102 in a non-conducting state, the depletion layer expands from the Schottky junction electrode 102. Since the field plate 107 and the Schottky junction electrode 102 are at a same potential level, the electric charge in the oxide film 106 is neutralized and consequently the depletion layer can easily expand on the substrate surface to reduce the potential gradient and make it possible to secure a high withstand voltage. This structure is characterized in the fact that a high withstand voltage region can be established in a small area, although the oxide film 106 can be broken down when a strong electric field is applied. Therefore, the oxide film 106 is accompanied by a problem of reliability.

FIG. 21 illustrates a guard ring structure. A number of p+ wells are arranged to surround a Schottky junction electrode 102 and form a guard ring 108. When a reverse bias voltage is applied in a non-conducting state, the depletion layer starts expanding from the edge termination layer 104 of the electrode 102 and gets to the first p+ guard ring 108. As the application of the voltage is kept on, the depletion layer expands further from the guard ring 108 and eventually gets to the outermost guard ring 108. This structure provides an advantage that a stable withstand voltage can be realized with ease. However, since the gaps separating adjacent guard rings 108 cannot be reduced remarkably, it is difficult to establish a high withstand voltage region in a small area. Additionally, the withstand voltage can vary significantly depending on the gaps separating adjacent guard rings.

FIG. 22 illustrates a withstand voltage structure formed on the principle of RESURF. This structure is realized by forming a RESURF layer 109 of a low impurity concentration p– well on the outer periphery of the edge termination layer 104 that is arranged along the edge of the Schottky junction electrode 102. The depletion layer starts expanding from the pn junction between the RESURF layer 109 and the n substrate 101 when a reverse bias voltage is applied. However, since the impurity concentration of the RESURF layer 109 is low, the depletion layer also expands into and completely depletes the layer 109. As a result, the RESURF layer 109 also bears the voltage and realizes a high withstand voltage. Like the field plate structure, this structure is also adapted to reduce the area requirement.

A high withstand voltage semiconductor device having a RESURF structure can achieve a withstand voltage close to the ideal one calculated from the thickness and the impurity concentration of the substrate by optimizing the impurity concentration, the width, the depth and other parameters of the RESURF layer 109

However, if the RESURF 109 shows a high impurity concentration, the electric field can be converged to the end of the RESURF layer 109 to reduced the withstand voltage because the RESURF layer 109 is not completely depleted. If, on the other hand, the impurity concentration of the RESURF layer 109 is too low, the layer becomes depleted to reduce the effect of alleviating the electric field at the end of the edge termination layer 105 and lower the withstand voltage even when the applied voltage is still low.

Thus, the peak withstand voltage can be optimized by optimizing the impurity concentration of the RESURF layer 109. The peak withstand voltage also depends on the width of the RESURF layer 109 and the withstand voltage increases as a function of the length of the RESURF layer 109 to make it close to the ideal one.

On the other hand, the maximum withstand voltage of the RESURF structure is very critical relative to the impurity concentration of the low impurity concentration layer that constitutes the RESURF layer and remarkably falls when the impurity concentration is not optimized. Particularly, in the case of a high withstand voltage semiconductor device comprising an SiC substrate, the impurity concentration of the RESURF layer can vary widely because of the difficulty of controlling the impurity activation ratio. This means that the process of manufacturing high withstand voltage semiconductor devices is subject to variances to consequently disperse the withstand voltage characteristics of products. Then, it is difficult to provide high quality semiconductor devices on a reliable basis.

In view of the above identified problems, it is therefore the object of the present invention to provide a high withstand voltage semiconductor device having a RESURF structure that can maintain its high withstand voltage regardless of variances in the impurity concentration of the RESURF layer.

A structure formed on the condition of completing depleting the RESURF layer as in the case of a composite structure of RESURF structure and guard ring structure as proposed in Japanese Patent Publication No. 8-306937 and Japanese Patent Publication No. 3-147331 cannot show a high withstand voltage in a concentration range above the optimal concentration of the RESURF layer. The present invention is aimed at maintaining a high withstand voltage in a concentration range above the optimal concentration of the RSURF layer.

Additionally, a composite structure of RESURF structure and guard ring structure as proposed in Japanese Patent Application No. 8-306937 cannot show a high withstand voltage in a concentration range below the optimal concentration of the RESURF layer. The present invention is aimed at maintaining a high withstand voltage in a concentration range below the optimal concentration of the RESURF layer.

BRIEF SUMMARY OF THE INVENTION

In an aspect of the invention, there is provided a high withstand voltage semiconductor device comprising:
a semiconductor layer of a first conductivity type;
a first electrode formed on part of the front surface of said semiconductor layer;
a second electrode formed on the rear surface of said semiconductor layer;
a first low impurity concentration semiconductor region of a second conductivity type formed on the front surface of said semiconductor layer;
a first high impurity concentration semiconductor region of the second conductivity, type formed in the inside of said first low impurity concentration semiconductor region and arranged so as to overlap an end of said first electrode;
a second high impurity concentration semiconductor region of the second conductivity type formed inside said first low impurity concentration semiconductor region and arranged so as to surround said first high impurity concentration semiconductor region with a gap separating therebetween; and
a second low impurity concentration semiconductor region of the second conductivity type formed on the surface of said semiconductor layer and arranged so as to surround said first low impurity concentration semiconductor region with a gap separating therebetween.

Preferably, said first low impurity concentration semiconductor region has a width not smaller than the largest value of the depletion layer that expands when a high voltage is applied to and breaks down said first conductivity type semiconductor layer (as expressed by Emax*eps/(q*Nd), when the largest breakdown electric field is Emax(V/m), the dielectric constant of the semiconductor is eps(F/m), the unit electric charge is q(C) and the impurity concentration of the semiconductor layer is Nd(1/m$^3$).

In another aspect of the invention, there is provided a high withstand voltage semiconductor device comprising:
a semiconductor layer of a first conductivity type;
a first electrode formed on part of the front surface of said semiconductor layer;
a second electrode formed on the rear surface of said semiconductor layer;
a a RESURF layer of a low impurity concentration semiconductor region of the second conductivity type formed on the front surface of said semiconductor layer;
an edge termination layer of a high impurity concentration semiconductor region of the second conductivity type formed in the inside of said RESURF layer and arranged so as to overlap an end of said first electrode;
an inner ring of a high impurity concentration semiconductor region of the second conductivity type formed in the inside of said RESURF layer and arranged so as to surround said edge termination layer with a gap separating therebetween; and
an outer ring of a low impurity concentration semiconductor region of the second conductivity type formed on the surface of said semiconductor layer and arranged so as to surround said RESURF layer with a gap separating therebetween.

Preferably, the RESURF layer has a width not smaller than the largest value of the depletion layer that expands when a high voltage is applied to and breaks down said first conductivity type semiconductor layer (as expressed by Emax*eps/(q*Nd), when the largest breakdown electric field is Emax(V/m), the dielectric constant of the semiconductor is eps(F/m), the unit electric charge is q(C) and the impurity concentration of the semiconductor layer is Nd(1/m$^3$)).

Then, if the dose of the first low impurity concentration semiconductor region, or the RESURF layer, varies from the optimal dose (as expressed by=Emax*eps/q), when the largest breakdown electric field is Emax(V/m), the dielectric constant of the semiconductor is eps(F/m) and the unit electric charge is q(C)), the withstand voltage of the device is prevented from falling due to the effect of the inner and outer rings.

Instill another aspect of the invention, there is provided a high withstand voltage semiconductor device comprising:
a semiconductor layer of a first conductivity type;
a first electrode formed on part of the front surface of said semiconductor layer;
a second electrode formed on the rear surface of said semiconductor layer;
a first low impurity concentration semiconductor region of a second conductivity type formed on the front surface of said semiconductor layer;
a dose of said first low impurity concentration semiconductor region being greater than the optimal dose, the width of said first low impurity concentration semiconductor region being greater than the largest value of that of the depletion layer; and
a second low impurity concentration semiconductor region of the second conductivity type formed on the surface of the front surface of said semiconductor layer and arranged so as to surround said first low impurity concentration semiconductor region with a gap therebetween;

The above defined simple structure comprising an outer ring formed around the first low impurity concentration semiconductor region and having an impurity concentration substantially same as the latter is effective for preventing the withstand voltage from falling when the impurity concentration of the first low impurity concentration semiconductor region is higher than the optimal level due to the functional feature of the outer ring.

While the surface area of the device may be slightly greater than those of comparable known devices because of the arrangement of one or more than one outer rings around the first low impurity concentration semiconductor region, such an increased area does not give rise to any problem because the number of outer rings is minimal.

In still another aspect of the invention, there is provided a high withstand voltage semiconductor device comprising:

a semiconductor layer of a first conductivity type;

a first electrode formed on part of the front surface of said semiconductor layer;

a second electrode formed on the rear surface of said semiconductor layer;

a first low impurity concentration semiconductor region of a second conductivity type formed on the front surface of said semiconductor layer;

the dose of said first low impurity concentration semiconductor region being smaller than the optimal dose, the width of said first low impurity concentration semiconductor region being greater than the largest value of that of the depletion layer; and a first high impurity concentration semiconductor region of the second conductivity type formed in the inside of said first low impurity concentration semiconductor region and arranged so as to overlap an end of said first electrode; and a second high impurity concentration semiconductor region of the second conductivity type formed in the inside of said first low impurity concentration semiconductor region and arranged so as to surround said first high impurity concentration semiconductor region with a gap separating therebetween.

The above defined simple structure comprising an inner ring formed in the inside of the first low impurity concentration semiconductor region and having an impurity concentration substantially same as the first high impurity concentration semiconductor region is effective for preventing the withstand voltage from falling when the impurity concentration of the first low impurity concentration semiconductor region is lower than the optimal level due to the functional feature of the inner ring.

While the RESURF layer operating as RESURF may be formed to have a relatively large width because of the arrangement of one or more than one inner rings in the inside of the first low impurity concentration semiconductor region, the relatively large width and the resultant relatively large surface area of the device does not give rise to any problem because the number of inner rings is minimal.

BRIEF DESCRIPTION OF THE DRAWINGS

FIG. 4 is a graph illustrating the relationship between the surface concentration of the RESURF layer and the withstand voltage of the first embodiment in comparison with the withstand voltage of a device comprising only a RESURF layer.

FIG. 5 is a graph obtained by reducing the surface concentration of the RESURF layer of FIG. 4 into the dose.

DETAILED DESCRIPTION OF THE INVENTION

Now, the present invention will be described in greater detail by referring to the accompanying drawings that illustrate embodiments of the invention.

Figure 1:
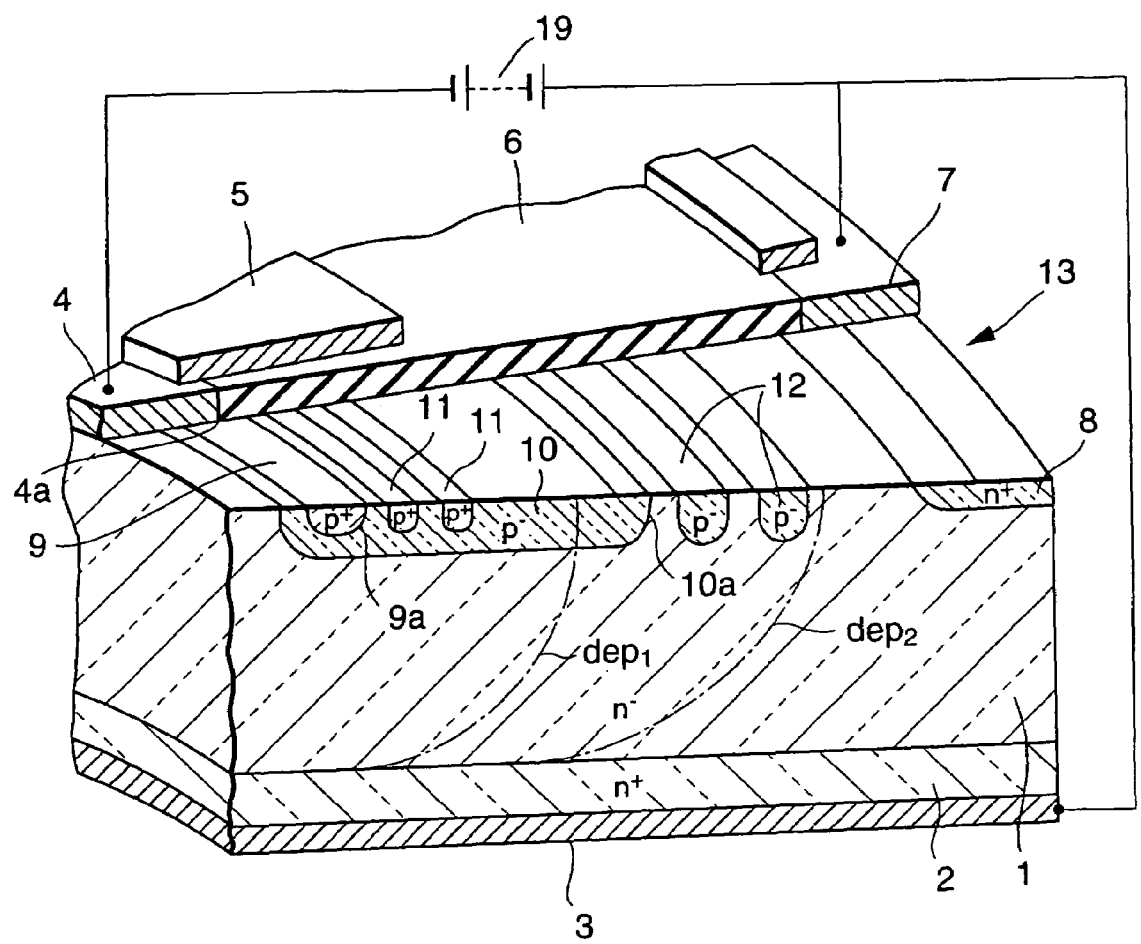
FIG. 1 is a partly cut away perspective view of the first embodiment of high withstand voltage semiconductor device according to the invention, showing part of it in cross section.

FIG. 1 is a partly cut away perspective view of the first embodiment of high withstand voltage semiconductor device according to the invention, which is a Schottky barrier diode having a disk-shaped substrate. It will be appreciated that only a sector-like part of the device is shown in FIG. 1.

As shown in FIG. 1, the Schottky barrier diode comprises an n− type semiconductor layer (substrate) 1, a first electrode 4 which is a Schottky junction electrode arranged in a central area of the front surface of the n− type semiconductor substrate 1, an edge termination layer 9 which is a p+ type high impurity concentration layer formed along the peripheral edge of the electrode by using the substrate surface, an n+ type high impurity concentration layer 2 formed on the rear surface of the substrate and a second electrode 3 which is an opposing electrode held in contact with the layer 2.

A number of inner ring layers 11 having a predetermined width, which are p+ type high impurity concentration layers, are formed to surround the outer periphery of the edge termination layer 9 on the front surface of the n− type semiconductor layer 1. Two inner ring layers 11 are shown in FIG. 1 and separated from each other and also from the edge termination layer 9 by given gaps. The impurity concentration of the inner ring layers 11 is substantially same as that of the edge termination layer 9. The effect of inner ring layer 11 is more reliable when more than one such layers are provided.

Additionally, a RESURF layer 10 which is a p− type low impurity layer is formed on the front surface of the n− type semiconductor substrate 1 with a predetermined width as viewed in a radial direction of the substrate in such a way that it covers the edge termination layer 9 and the inner ring layers 11. The impurity concentration of the RESURF layer 10 is lower than that of the edge termination layer and that of the inner ring layers 11. The RESURF layer 10 contacts the first electrode 4 and the edge termination layer 9 along an inner peripheral edge thereof. The RESURF layer 10 may have a depth smaller than that of the edge termination layer 9 and that of the inner ring layers 11.

Furthermore, a number of outer ring layers 12, which are p− type low impurity concentration layers, are formed to surround the RESURF layer with a gap separating it from the latter on the front surface of the n− type semiconductor layer 1. The impurity concentration of the outer rings 12 is substantially same as that of the RESURF layer 10. The effect of outer ring layer 12 is more reliably when more than one such layers are provided.

A flange-like field plate 5 is formed on and electrically connected to the first electrode 4. It outwardly extends from the latter. The field plate 5 is disposed oppositely relative to the semiconductor substrate 1 with an oxide insulating film 6 interposed between them. The field plate is formed in such a way that it covers the inner ring layers 11 and its edges are located above the RESURF layer 10. With this arrangement, the withstand voltage is prevented from degrading due to variances in the impurity concentration of the RESURF layer 10 if the concentration is lower than the optimal value.

A channel stopper region 8, which is an n+ type high impurity control circuit layer, is formed along the outer edge of the n− type semiconductor substrate 1 so as to surround the outer ring layers 12. A third electrode 7 is arranged on the channel stopper region 8 and electrically connected to the second electrode 3. The channel stopper region 8 prevents the channel and the depletion layer from expanding to the outside of the device. The region extending from the outer edge of the first electrode 4 to the channel stopper region 8 and concentrically surrounding the first electrode 4 is a terminating region 13 of the withstand voltage structure.

As the second electrode 3 and the channel stopper layer 7 are short-circuited and a reverse bias voltage is applied between the second electrode 3 and the first electrode 4 from a power source 19, a depletion layer dep 2 is generated in the semiconductor layer 1.

If neither a RESURF layer 10 nor a field plate 5 are formed and only the first electrode 4 and the second electrode 3 are provided, the outer edge of the depletion layer dep 1 shows profile whose cross section is a quarter of a circle having its center located on the edge 4a of the first electrode 4 in the semiconductor layer at a time when a maximum voltage is applied to the device to break down the semiconductor layer 1. Assume that this depletion layer is a reference depletion layer. Then, the depletion layer dep 2 generated due to the RESURF layer 10 is an expanded depletion layer. The width of the RESURF layer 10 as viewed in a radial direction of the device is made greater than that of the reference depletion layer dep 1. Then, the depletion layer is expanded in radial directions of the semiconductor layer as shown in FIG. 1. The optimal value of the dose and that of the width (the distance from the outer edge 9a of the edge termination layer 9 to the outer edge 10a of the RESURF layer 10) of the ring-shaped RESURF layer 10 are determined in a manner as described below.

The optimal dose $do(1/m^2)$ for completely depleting the RESURF layer is a function of the maximum breakdown field intensity $Emax(V/m)$. If the dielectric constant of the semiconductor substrate is $eps(F/m)$ and the unit charge is $q(C)$, $do$ is expressed by the equation below.

$$do = Emax \cdot eps/q$$

The width w of the RESURF layer is substantially equal to the depth of the depletion layer of non-punch-through structure. If the impurity concentration of the n− substrate is $Nd(1/m^3)$, the width w is expressed by the equation below.

$$w = Emax \cdot eps/(q \cdot Nd)$$

The does do and the width w shows the values listed below when the substrate is made of silicon carbide (4H—SiC) and when it is made of silicon (Si).

|  | do | w |
| --- | --- | --- |
| 4H – SiC | $1.2 \times 10^{13}$ cm$^{-2}$ | 23 µm (Nd: $5 \times 10^{15}$ cm$^{-3}$) |
|  |  | 40 µm (Nd: $3 \times 10^{15}$ cm$^{-3}$) |
| Si | $2.0 \times 10^{12}$ cm$^{-2}$ | 400 µm (Nd: $5 \times 10^{13}$ cm$^{-3}$) |

Figure 2:
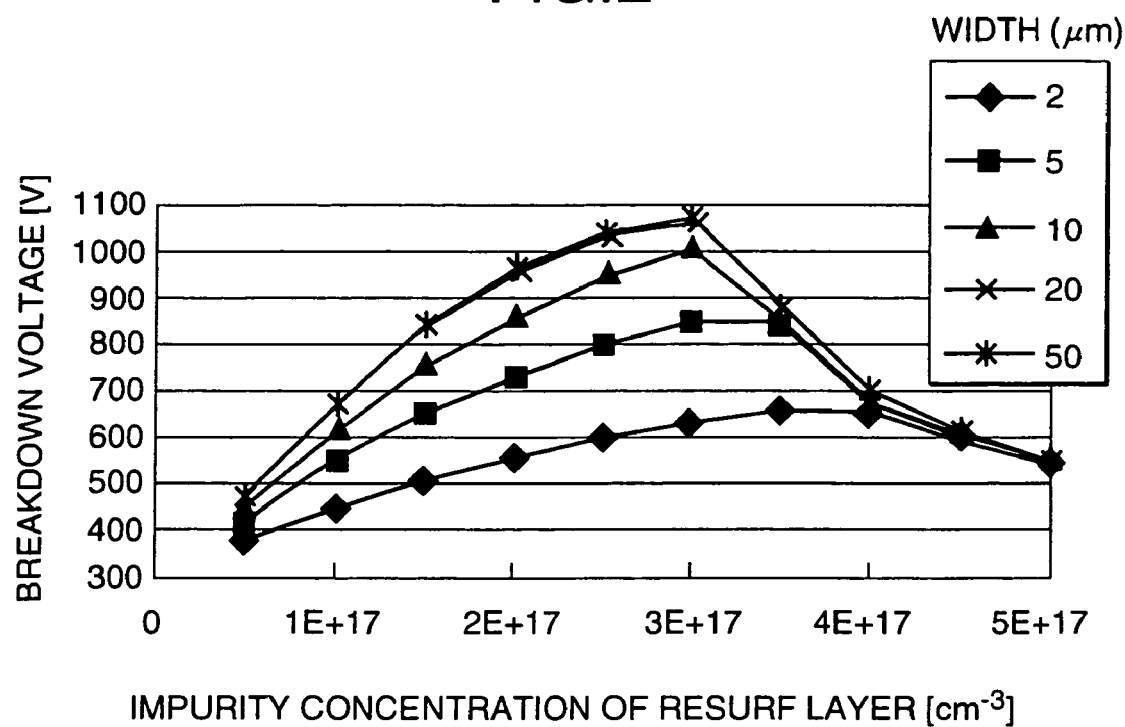
FIG. 2 is a graph illustrating the withstand voltage characteristic of a RESURF structure in terms of the relationship between the surface concentration of the RESURF layer and the withstand voltage, using the width of the RESURF layer as parameter.
Figure 3:
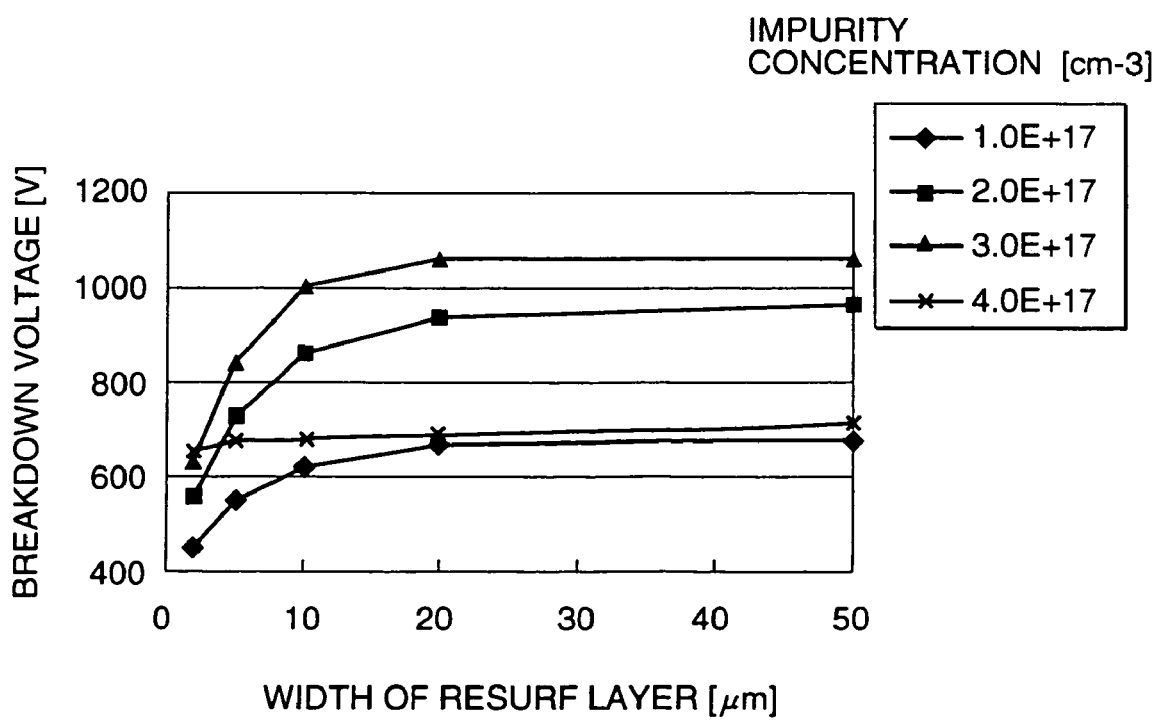
FIG. 3 is a graph illustrating the withstand voltage characteristic of a RESURF structure in terms of the relationship between the width of the RESURF layer and the withstand voltage, using the surface concentration of the RESURF layer as parameter.

FIG. 2 illustrates the relationship between the surface concentration of the RESURF layer and the withstand voltage when a device is formed by using an n− type 4H—SiC substrate with a concentration of Nd=$3.3 \times 10^{15}$ cm$^{-3}$ and a withstand voltage structure is provided only by a RESURF layer. FIG. 3 illustrates the relationship between the width of the RESURF layer and the withstand voltage of the device. From the graphs, it will be seen that the surface concentration of the RESURF layer that provides the maximum withstand voltage is $3 \times 10^{17}$ cm$^{-3}$ and the withstand voltage does not increase if the width is raised further.

The graphs also show that the withstand voltage varies as the surface concentration of the RESURF layer changes. Curve B in the graph of FIG. 4 shows the relationship between the withstand voltage and the surface concentration of the RESURF layer. It will be seen that the maximum withstand voltage is obtained when the concentration is equal to $3 \times 10^{17}$ cm$^{-3}$ and falls before and after the concentration level. The change is remarkable and critical.

As described above by referring to FIG. 1, this embodiment comprises p+ type inner ring layers 11 arranged inside of the RESURF layer and p− type outer ring layers 12 arranged outside the RESURF layer. It shows a withstand voltage—surface concentration relationship as indicated by the curve A in FIG. 4.

FIG. 4 is a graph illustrating in comparison the withstand voltage of a structure according to the invention, that of a structure having only a RESURF layer and that of a structure obtained by adding a field plate layer to a RESURF layer. In the graph of FIG. 4, the horizontal axis represents the surface concentration (cm−3) of the RESURF layer 10, while the vertical axis represents the withstand voltage (V).

As seen from the curve A in FIG. 4, the withstand voltage of a high withstand voltage semiconductor device according to the invention and illustrated in FIG. 1 is maintained to a level higher than 900V without showing any significant changes if the surface concentration is made to vary by a magnitude of a digit from $1\times10^{17}$ cm$^{-3}$ and $1\times10^{18}$ cm$^{-3}$, a range including the optimal surface concentration of the RESURF layer of $3\times10^{17}$ cm$^{-3}$. This is because inner ring layers 11 are formed in the RESURF layer 10 for the purpose of compensation relative to a low impurity concentration zone while outer ring layers 12 are formed to surround the RESURF layer 10 with a gap disposed between them for the purpose of compensation relative to a high concentration zone.

As shown by the curve B in FIG. 4, the withstand voltage of a high withstand voltage semiconductor device having only a RESURF layer comes to a peak at the surface concentration of the RESURF layer of $3\times10^{17}$ cm$^{-3}$ but falls remarkably before and after the peak.

The curve C in FIG. 4 shows the withstand voltage of a high withstand voltage semiconductor device having a field plate layer 5 formed on the RESURF layer 10, the ends of the field plate layer 5 being found above the RESURF layer 10, for the purpose of comparison. This structure is effective for maintaining the withstand voltage to a high level when the concentration of the RESURF layer 10 is lower than the optimal level. If, on the other hand, the ends of the field plate layer 5 are found outside the RESURF layer 10, the structure is effective for maintaining the withstand voltage to a high level when the concentration of the RESURF layer 10 is higher than the optimal level, although it is accompanied by a problem that the insulating film 6 is subjected to an intense electric field.

FIG. 5 is a graph illustrating the relationship between the impurity dose (cm−2) of the RESURF layer 10 and the withstand voltage of the structure. In FIG. 5, the horizontal axis represents the impurity dose of the RERSURF layer 10 as expressed by integrated value of the impurity concentration along with a vertical line across the RESURF layer 10, while the vertical axis represents the withstand voltage (V).

Figure 6:
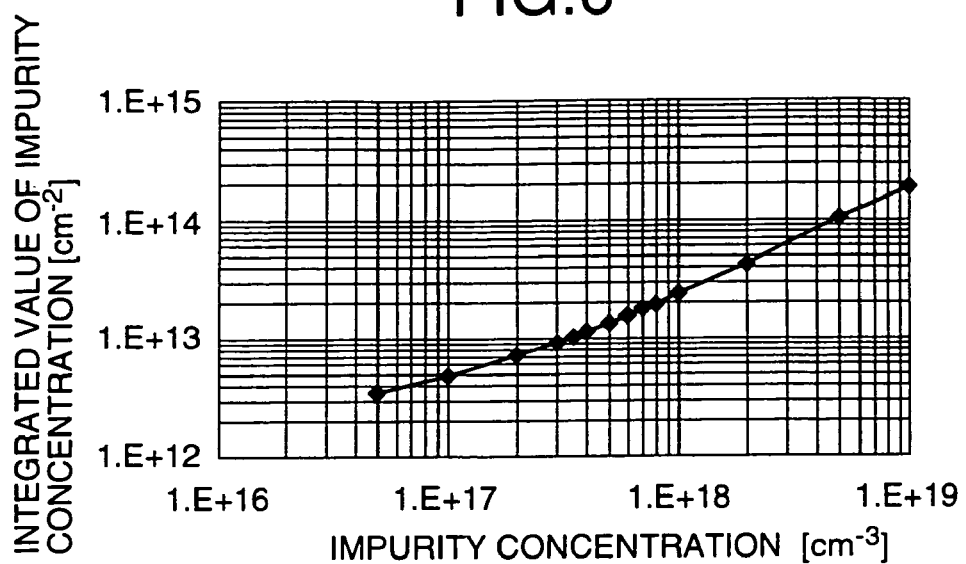
FIG. 6 is a graph illustrating the relationship between the surface concentration and the integrated value of the impurity concentration.

FIG. 6 is a graph illustrating the relationship between the surface concentration (cm$^{-3}$) and the dose (integrated value (cm$^{-2}$) of the impurity concentration) of the RESURF layer 10.

The impurity concentration of the RESURF layer 10 of a high withstand voltage semiconductor device realized by using a SiC substrate can vary widely because of the difficulty of controlling the impurity activation ratio. In the case of a 4H—SiC Schottky barrier diode, the permissible range of impurity concentration of the surface of the RESURF layer 10 for achieving a level higher than 90% of the ideal withstand voltage is only between $2\times10^{17}$ cm$^{-3}$ and $3\times10^{17}$ cm$^{-3}$, which is very narrow as seen from the curve B in FIG. 4B if the withstand structure solely relies on the RESURF layer.

To the contrary, the corresponding rage of the embodiment of the present invention illustrated in FIG. 1 is very wide and extends from $5\times10^{16}$ cm$^{-3}$ to $7\times10^{17}$ cm$^{-3}$.

Thus, the withstand voltage of the embodiment of the present invention is effectively prevented from falling due to variances in the impurity concentration if the impurity concentration of the RESURF layer 10 is shifted upwardly or downwardly from the optimal value.

Figure 9:
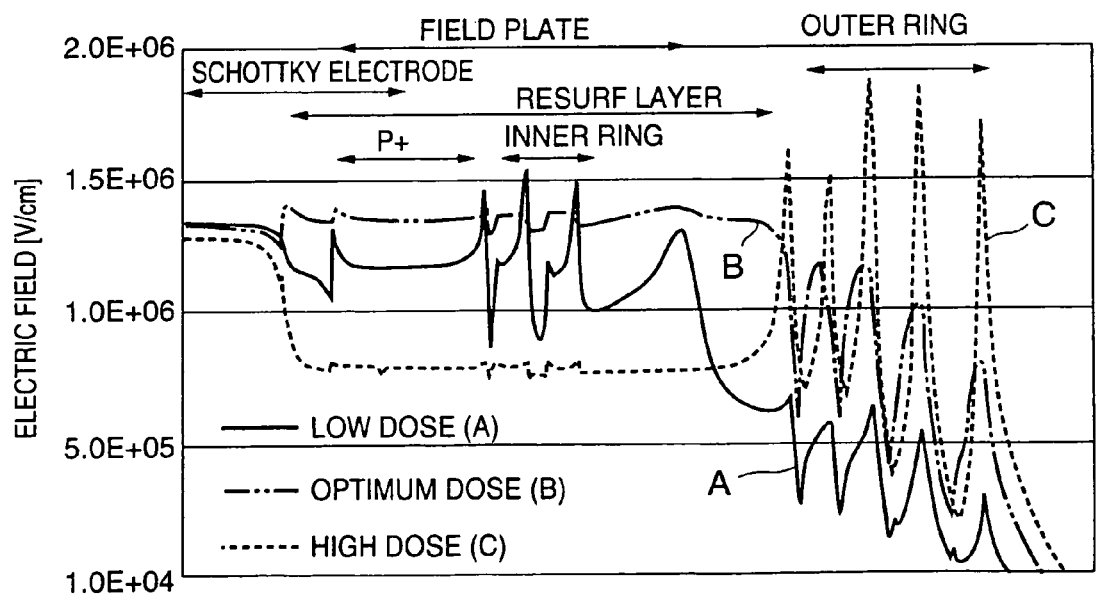
FIG. 9 is a graph illustrating relation between the withstand voltage structure and the electric field intensity of another embodiment of the invention.
Figure 10A:
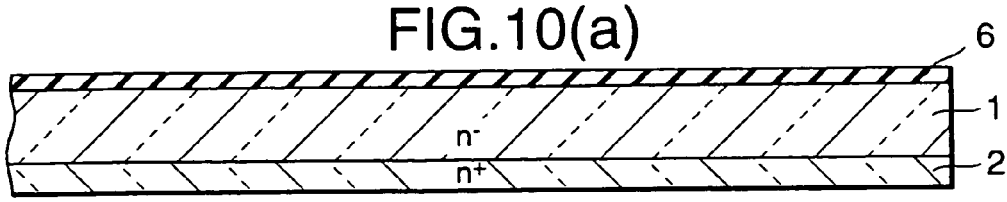
FIGS. 10A through 10G are schematic cross sectional views of the first embodiment of high withstand semiconductor device according to the invention, illustrating the manufacturing steps thereof.
Figure 10B:
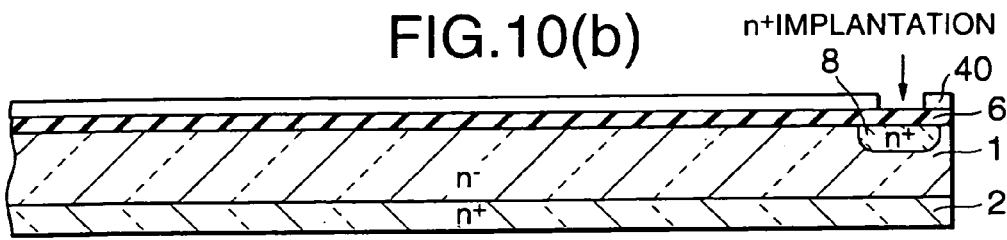
Figure 10C:
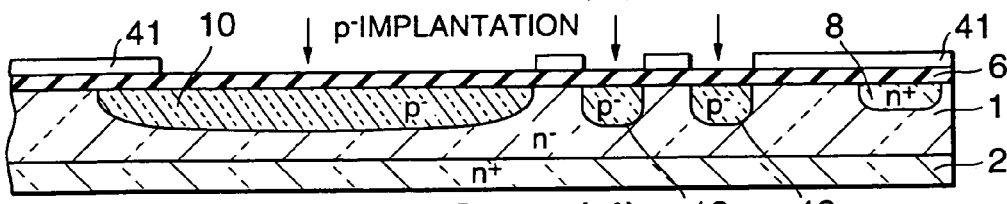
Figure 10D:
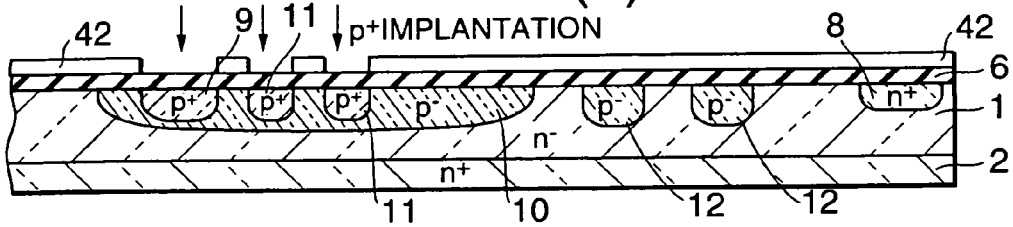
Figure 10E:
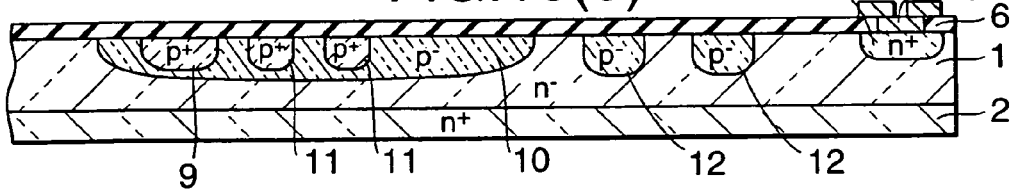
Figure 10F:
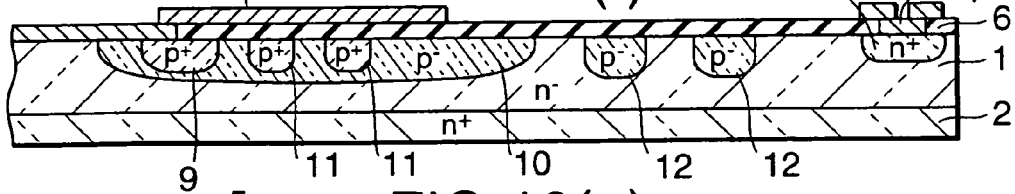
Figure 10G:
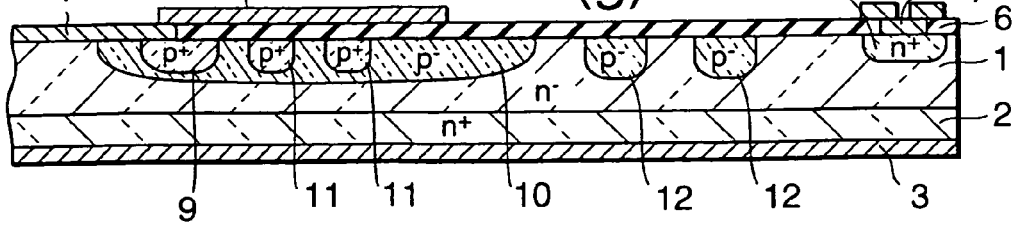

FIG. 9 is a graph illustrating the electric field intensity on and near the surface of a high withstand voltage semiconductor device having a configuration as shown in FIG. 1 and comprising a RESURF layer 10, two inner ring layers 11 and four outer ring layers 12 formed outside the RESURF layer 10. The graph shows three curves obtained when the impurity concentration of the RESURF layer and the outer ring layers is low, optimal and high.

In FIG. 9, the curve A indicates the electric field intensity of the RESURF layer 10 and the outer ring layers 12 showing a low impurity concentration. The electric field intensity is high at the end of the edge termination and in the inner ring layers 11, evidencing that the inner ring layers takes an important role in achieving a high withstand voltage.

The curve B in FIG. 9 indicates the electric field intensity of the RESURF layer 10 and the outer ring layers 12 having the optimal impurity concentration. It will be seen that a high withstand voltage is achieved by the RESURF layer 10 and the field plate layer 5, although the inner ring layers 11 and the outer ring layers 12 do not particularly play an important role in achieving a high withstand voltage.

The curve C in FIG. 9 indicates the electric field intensity of the RESURF layer 10 and the outer ring layers 11 showing a high impurity concentration. The electric field intensity is high at the ends of the RESURF layer and at the outer rings 12, evidencing that the outer rings 12 takes an important role in achieving a high withstand voltage.

From the above description, it will be appreciated that the concentration zone that achieves a high withstand voltage can be expanded by using a large number of guard rings and the number of inner ring layers 11 that are high impurity concentration layers arranged inside the RESURF layer 10 needs to be increased to expand the high withstand voltage providing concentration zone when the concentration of the RESURF layer 10 is lower than the optimal level.

On the other hand, the number of outer ring layers 12 that are low impurity concentration layers arranged outside the RESURF layer 10 needs to be increased to expand the high withstand voltage providing concentration zone when the concentration of the RESURF layer 10 is higher than the optimal level. The practical range of impurity dose of the RESURF layer is between 0.8 and 10 times of the optimal dose.

Figure 7:
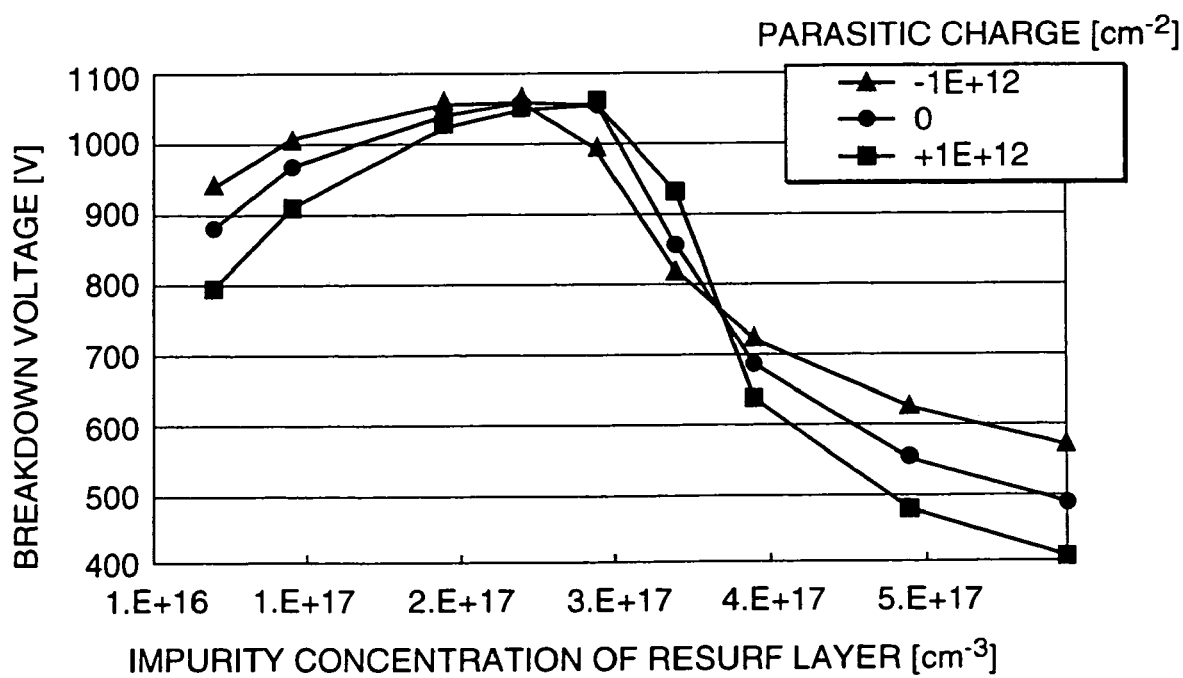
FIG. 7 graph illustrating the influence of the fixed charge of a known RESURF structure on the withstand voltage.

FIG. 7 illustrates the results of a simulation obtained by using a known RESURF structure with a fixed interface electric charge between $-1\times10^{12}$ and $+1\times10^{12}$ cm$^{-2}$. The graph of the withstand voltage shifts to the lower concentration side when the concentration of the RESURF layer is lower than the optimal level due to the influence of the fixed negative electric charge. On the other hand, the withstand voltage is improved when the concentration of the RESURF layer is higher than the optimal level. The withstand voltage is improved when the concentration of the RESURF layer is lower than the optimal level probably because the RESURF layer and the substrate surface are made liable to be depleted and a high withstand voltage is achieved with the low impurity concentration of the RESURF layer so much for the fixed negative electric charge. Similarly, the withstand voltage is improved with the concentration of the RESURF layer is higher than the optimal level probably because the RESURF layer and the substrate surface are made liable to be depleted and the electric field is alleviated at the ends of the RESURF layer under the influence of the fixed electric charge. The graph of the withstand voltage shifts to the higher concentration side in a region where the concentration of the RESURF layer is lower than the optimal level when there exists a fixed positive electric charge, whereas the withstand voltage is reduced when the concentration of the RESURF layer is higher than the optimal level. In other words, the concentration dependency of the withstand voltage is raised to by turn narrow the concentration zone of the RESURF layer that can provide a high withstand voltage. This is probably because, as opposed to the instance of a fixed negative electric charge, electrons are drawn by the fixed positive electric charge on the surface of the RESURF layer to relatively reduced the impurity concentration of the RESURF layer and shift the optimal concentration so much to the higher side but the surface of the n– type semiconductor substrate is made less apt to be depleted than the RESURF layer to consequently reduce the withstand voltage from the level that is achieved when the concentration of the RESURF layer is optimal.

Figure 8:
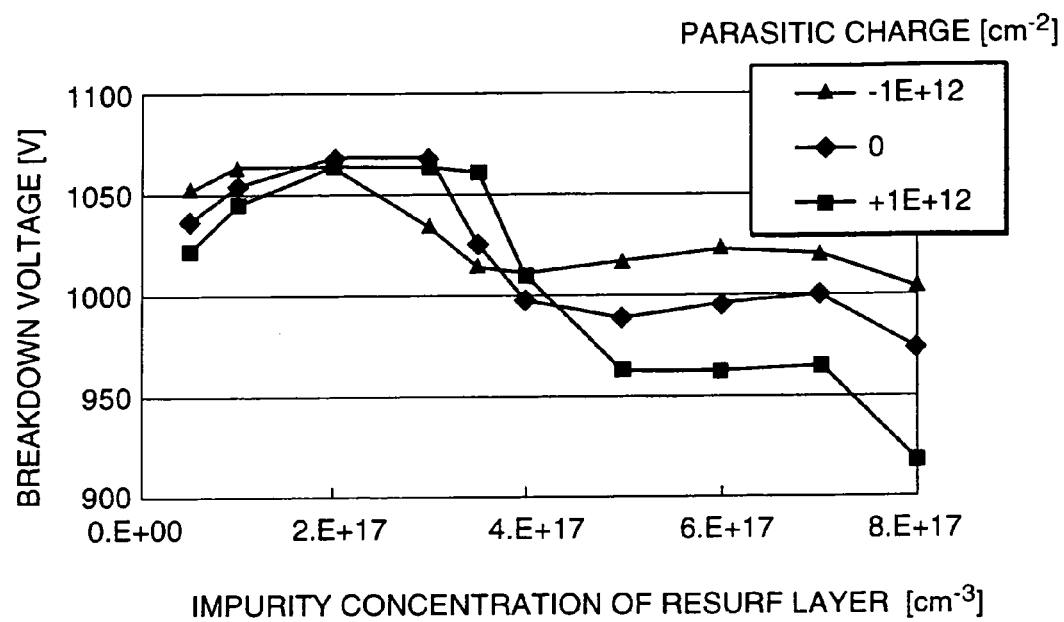
FIG. 8 is a graph illustrating the influence of the fixed charge of the embodiment on the withstand voltage.

FIG. 8 shows the withstand voltage of a structure according to the invention when there exists a fixed electric charge between $-1 \times 10^{12}$ and $+1 \times 10^{12}$ cm$^{-2}$ on the SiC/SiO$_2$ interface. As seen from the graph of FIG. 8, the optimal concentration of the RESURF layer is shifted to the lower side just like the RESURF structure under the influence of the fixed negative electric charge and the withstand voltage is improved when the concentration of the RESURF layer is higher than the optimal level. On the other hand, the optimal concentration of the RESURF layer shifts to the higher side when there exists a fixed positive electric charge and the withstand voltage is reduced when the concentration of the RESURF layer is higher than the optimal level. The concentration of the RESURF layer is made to get to $5 \times 10^{18}$ cm$^{-3}$ in the graph of FIG. 8. As the concentration of the RESURF layer approaches $5 \times 10^{18}$ cm$^{-3}$, the withstand voltage of the structure of the present invention comes close to that of a known guard ring structure and then falls further because the four guard rings (the four high concentration outer rings) cannot provide a satisfactorily high withstand voltage. Particularly, the withstand voltage falls rapidly when there exists a fixed positive electric charge because the depletion layer can hardly expand and the device breaks down before the outermost ring operates effectively.

The structure of the present invention maintains the withstand voltage of 950 V or above with a concentration of the RESURF layer between $5 \times 10^{16}$ and $7 \times 10^{17}$ cm$^{-3}$ if it is influenced by a fixed electric charge. Thus, it is more resistant against the influence of a fixed electric charge than any known RESURF structures.

If the inner ring layers 11 and/or the outer ring layers 12 are located out of the right positions due to a displaced mask or some other reason and the effect of the guard rings are not maximized, the structure of the present invention is less subject to degradation of withstand voltage due to such positional or dimensional variances if compared with conventional guard ring structures because the withstand voltage of the RESURF structure provide the lower limit of the withstand voltage of the device.

Now, a method of manufacturing a high withstand voltage semiconductor device according to the invention and illustrated in FIG. 1 will be described below by referring to FIG. 10. More specifically, the device is a Schottky barrier diode comprising a 4H—SiC substrate.

The manufacturing process comprises steps (a) through (g). Firstly, in Step (a), a 4H—SiC substrate having an n– type semiconductor layer 1 and an n+ type semiconductor layer 2 formed on the rear surface of the layer 1 is brought in. The n– type semiconductor layer 1 may typically show an impurity concentration of $5 \times 10^{15}$ cm$^{-3}$ and has a thickness of 10 im. Note, however, the impurity concentration and the thickness of the n– type semiconductor layer 1 may vary depending on the withstand system of the device. Then, an insulating film 6, which is an oxide film, is formed on the n– type semiconductor layer 1 of the 4H—SiC substrate.

Then, in Step (b), a patterned mask 40 is formed on the surface of the 4H—SiC substrate and ions of an n+ type impurity are implanted to form a channel stopper region 8. For instance, phosphor ions may be implanted to a dose of $1 \times 10^{15}$ cm$^{-2}$ by applying an acceleration voltage in a number of stages, the voltage of each stage being between 10 and 100 keV, to produce a channel stopper region 8 having a box-shaped profile. Subsequently, the mask 40 is removed.

Thereafter, in Step (c), a patterned mask 41 is formed on the surface of the 4H—SiC substrate and ions of a p– type impurity are implanted to produce a RESURF layer 10, which is a p– type low impurity concentration layer, and outer ring layers 12, which are also p– type low impurity concentration layers. For instance, aluminum ions may be implanted to a dose of $1 \times 10^{13}$ cm$^{-2}$ by applying an acceleration voltage in a number of stages, the voltage of each stage being between 20 and 400 keV, to produce the layers having a box-shaped profile. Subsequently, the mask 41 is removed.

Then, in Step (d), a patterned mask 42 is formed on the surface of the 4H—SiC substrate and ions of p+ type impurity are implanted to produce an edge termination layer 98, which is a p+ type high impurity concentration layer, and inner ring layers 11, which are also p+ type high impurity concentration layers. For instance, aluminum ions may be implanted to a dose of $5 \times 10^{14}$ cm$^{-2}$ by applying an acceleration voltage in a number of stages, the voltage of each stage being between 10 and 200 keV, to produce the layers having a box-shaped profile. Subsequently, the mask 42 is removed.

Thereafter, in Step (e), the insulating film 6 on the channel stopper region 8 is removed. Subsequently, an ohmic electrode 7 of nickel is formed on the channel stopper region 8. An electrode 3 may also be formed in this step and the electric resistances of the two electrodes 7, 3 may be reduced at the same time by annealing. The electrode 3 may be made to show a multilayer structure comprising a nickel layer and a titanium layer formed sequentially on the substrate in the above mentioned order. Alternatively, the electrode 3 may have a multilayer structure comprising a nickel layer and a gold layer formed sequentially on the substrate in the above mentioned order.

Then, in Step (f), the insulating film 6 is removed part of the edge termination layer 9 and the RESURF layer 10. Subsequently, a Schottky electrode 4 is formed on the part of the edge termination layer 9 and the RESURF layer 10. The edge termination layer 9 is made to contact an end of the Schottky electrode 4. At the same time, a filed plate layer 5 of titanium is formed so as to extend onto the insulating film 6 also in this step.

In the final step, or Step (g), an ohmic electrode 3 of nickel is formed on the n+ type semiconductor layer 2 on the rear surface of the 4H—SiC substrate, although this step will be omitted if the electrode 3 is formed in Step (e) in a manner as described above.

In this way, a complete high withstand voltage semiconductor device as shown in FIG. 1 is manufactured.

There is no limit to the number of inner ring layers 11 that are formed in the inside of the RESURF layer 10. From the viewpoint of avoiding degradation of withstand voltage, a large number of inner ring layers 11 may preferably be formed. The inventors of the present invention found as a result of an experiment that the use of two to three inner ring layers 11 is very effective.

For example, the inner ring layers 11 may be 3 ìm wide and 0.3 ìm deep and the edge termination layer 9 and the innermost inner ring layer 11 may be separated from each other by a gap of 1 ìm, while the gap separating the innermost inner ring layer 11 and the immediately adjacent inner ring 11 may be equal to 2 ìm. It is possible to increase the concentration range that provides a withstand voltage equal to 90% or more of the ideal one by optimizing the gap separating the inner ring layers 11 and their width.

The RESURF layer 10 may be 40 ìm wide and 0.6 ìm deep. The number of outer ring layers 12 arranged outside the RESURF layer 10 is not subject to any limitations. Theoretically, the withstand voltage can be prevented from degradation when a large number of outer ring layers 12 are provided. The inventors of the present invention found as a result of an experiment that the use of three to five outer ring layers 11 is very effective. While the number of outer ring layers 11 is two in the description given above by referring to FIG. 10, a structure comprising four outer ring layers 12 will be described below.

The outer ring layers 12 may be 3 ìm wide and 0.6 ìm deep and the RESURF layer 10 and the innermost outer ring layer 12 may be separated from each other by a gap of 1 ìm, while the gap separating the innermost outer ring layer 12 and the first immediately adjacent outer ring 12 may be equal to 1 ìm. This first adjacent outer ring layer 12 and the second adjacent outer ring layer 12 may be separated from each other by a gap of 2 ìm, while the gap separating the second adjacent outer ring layer 12 and the third adjacent outer ring layer 12 may be equal to 3 ìm. It is possible to increase the concentration range that provides a withstand voltage equal to 90% or more of the ideal one by optimizing the gap separating the outer ring layers 12 and their width.

The channel stopper region 8 is electrically connected to the cathode 3 and operates to fix the surface potential of the semiconductor substrate. It also has an effect of preventing degradation of withstand voltage when the depletion layer gets to it. The impurity of the channel stopper region 8 may be either of the n+ type or of the p+ type. In this structure, the distance separating the outermost outer ring layer 12 and the channel stopper region 8 is not less than 30 ìm so that the depletion layer may not reach the channel stopper region 8.

The field plate layer 5 is electrically connected to the Schottky electrode 4. Preferably, the ends of the field plate layer 5 are found above the RESURF layer 10. In this structure, the field plate layer 5 is separated from the outer edge of the RESURF layer 10 by 10 ìm. The insulating film 6 is 1 ì thick.

The insulating film 6 between the channel stopper layer 9 and the corresponding end of the field plate 5 may be made thick and a second field plate may be formed. Alternatively, a field plate that is not electrically connected to the Schottky electrode may be arranged on the outer ring layers 12.

With a method of manufacturing a high withstand voltage semiconductor device according to the invention, the inner ring layers 11 located inside the RESURF layer 10 are formed by ion implantation simultaneously with the edge termination layer 9. Furthermore, the outer ring layers 12 located outside the RESURF layer 10 are formed by ion implantation simultaneously with the RESURF layer 10. This means that the number of steps of this manufacturing process is same as that of the process of manufacturing a conventional withstand voltage structure having only a RESURF structure.

Alternatively, the RESURF layer 10 and the outer ring layers 12 may be formed in different steps, using different impurity concentrations. Then, the number of masks to be used in the manufacturing process will be increased. Similarly, the edge termination layer 9 and the inner ring layers 11 may be formed in different steps, using different impurity concentrations. The structure can be designed further optimally so as to prevent degradation of withstand voltage more reliably by using different impurity concentrations.

The performance of the this embodiment was verified in a manner as described below.

Figure 22:
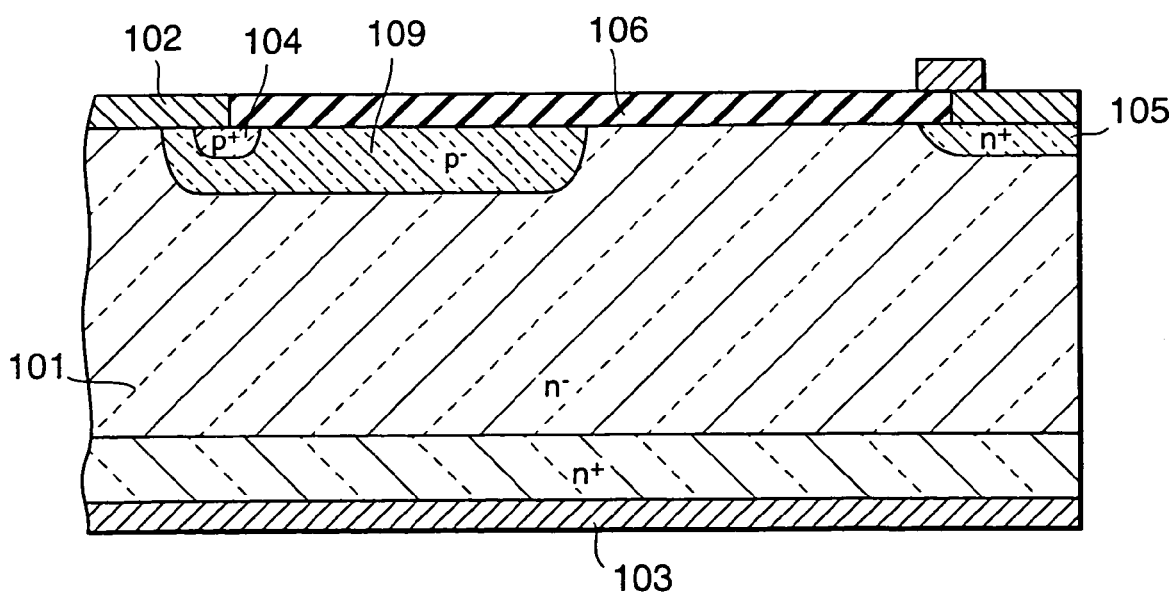
FIG. 22 is a schematic cross sectional view of a known RESURF withstand voltage structure.

Specimens of 4H—SiC Schottky barrier diode were prepared by using the structure of this embodiment (FIG. 1) for some of them and the conventional RESURF structure (FIG. 22) for the rest as termination structure. An n type 4H—SiC substrate (thickness: 10 µm, impurity concentration: $3.3 \times 10^{15}$ cm$^{-3}$) was used for each and every specimen and the dose (implanted impurity) of the p– layers (the RESURF layer 10 and the outer ring layers 12) was made to vary between $4 \times 10^{12}$ and $1 \times 10^{14}$ cm$^{-2}$ among the specimens. The dose of the edge termination layer 9 and that of the inner ring layers 11 were made equal to $3 \times 10^{14}$ cm$^{-2}$.

All the specimens showed a high withstand voltage of about 1,000 V when the dose was close to the optimal level of the conventional RESURF structure ($1 \times 10^{13}$ cm).

In the low dose zone ($4 \times 10^{12}$ to $1 \times 10^{13}$ cm$^{-2}$), the structure of the present invention provided a withstand voltage about 1.0 to 1.3 times greater than that of the conventional RESURF structure due to the effect of the inner ring layers 11.

In the high dose zone ($1 \times 10^{13}$ to $1 \times 10^{14}$ cm$^{-2}$), on the other hand, the structure of the present invention showed a withstand voltage about 1.0 to 1.8 times greater than that of the conventional RESURF structure due to the effect of the outer ring layers 12.

The specimen proved that the dose zone that provides a withstand voltage higher than 800 V is expanded by the present invention to show a width from $7.7 \times 10^{12}$ to $1.0 \times 10^{14}$ cm$^{-2}$, although the corresponding zone of the conventional RESURF structure is between $8.2 \times 10^{12}$ and $1.5 \times 10^{13}$ cm$^{-2}$. The dose zone that provides an optimal dose can be further expanded by optimizing the number, the interval of arrangement, the width and the depth of the inner ring layers 11 and those of the outer ring layer 12.

Figure 11:
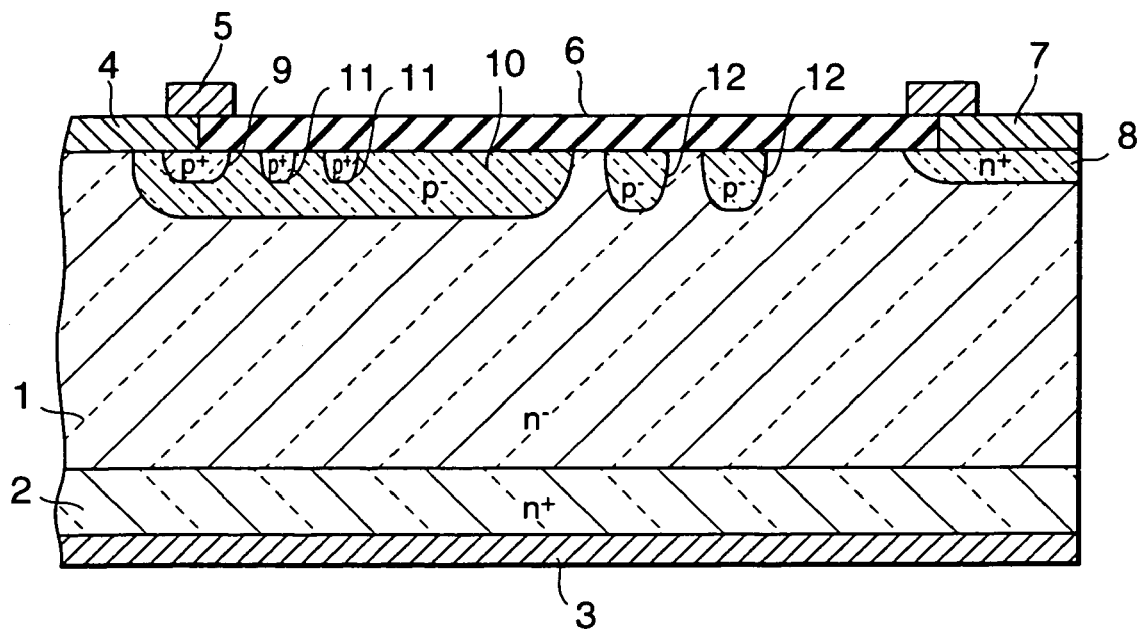
FIG. 11 is a schematic cross sectional view of a high withstand voltage semiconductor device obtained by modifying the first embodiment.

FIG. 11 schematically illustrates a high withstand voltage semiconductor device obtained by modifying the embodiment of FIG. 1. The high withstand voltage semiconductor device of FIG. 11 differs from that of FIG. 1 in that the ends of the field plate layer 5 do not extend to above the RESURF layer 10 but are found above the edge termination layer 9. Otherwise, the device has a structure same as that of the device of FIG. 1 and hence will not be described any further. This structure provides advantages same as those of the embodiment of FIG. 1.

Figure 12:
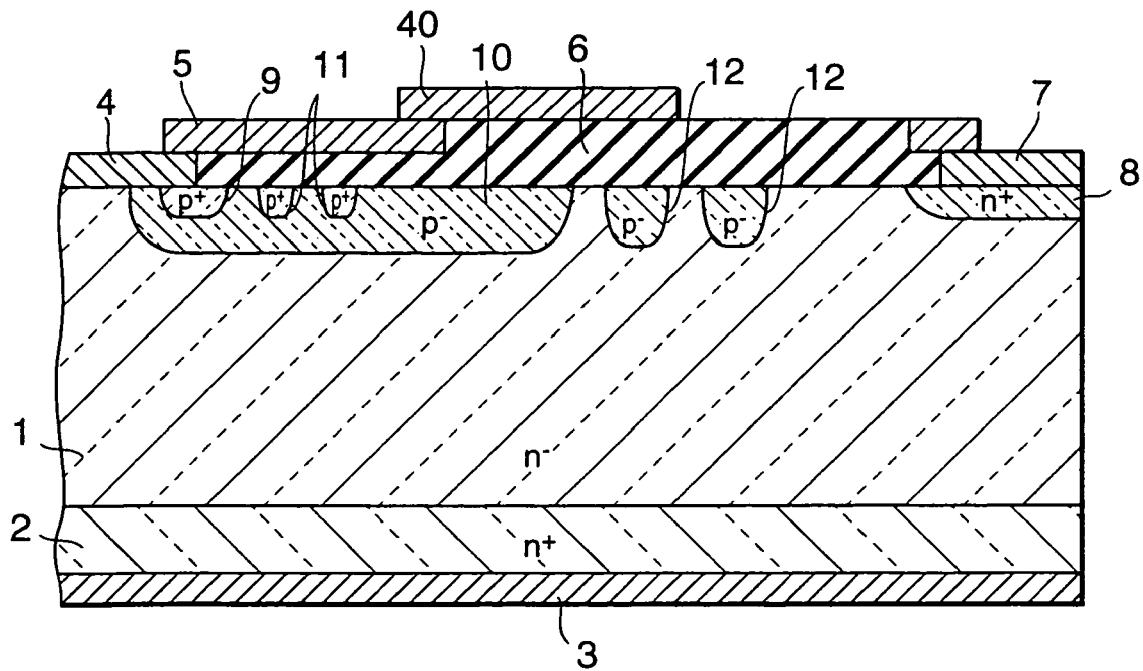
FIG. 12 is a schematic cross sectional view of another high withstand voltage semiconductor device obtained by modifying the first embodiment.

FIG. 12 schematically illustrates another high withstand voltage semiconductor device also obtained by modifying the embodiment of FIG. 1. The high withstand voltage semiconductor device of FIG. 12 differs from that of FIG. 1 in that it additionally comprises a second field plate 40 that is electrically connected to the field plate 5 and arranged above the semiconductor layer with the insulating film 6 interposed between them. The insulating film 6 is thicker under the second field plate 40 than under the first field plate 5. Otherwise, the device has a structure same as that of the device of FIG. 1 and hence will not be described any further. This structure provides advantages same as those of the embodiment of FIG. 1.

Figure 13:
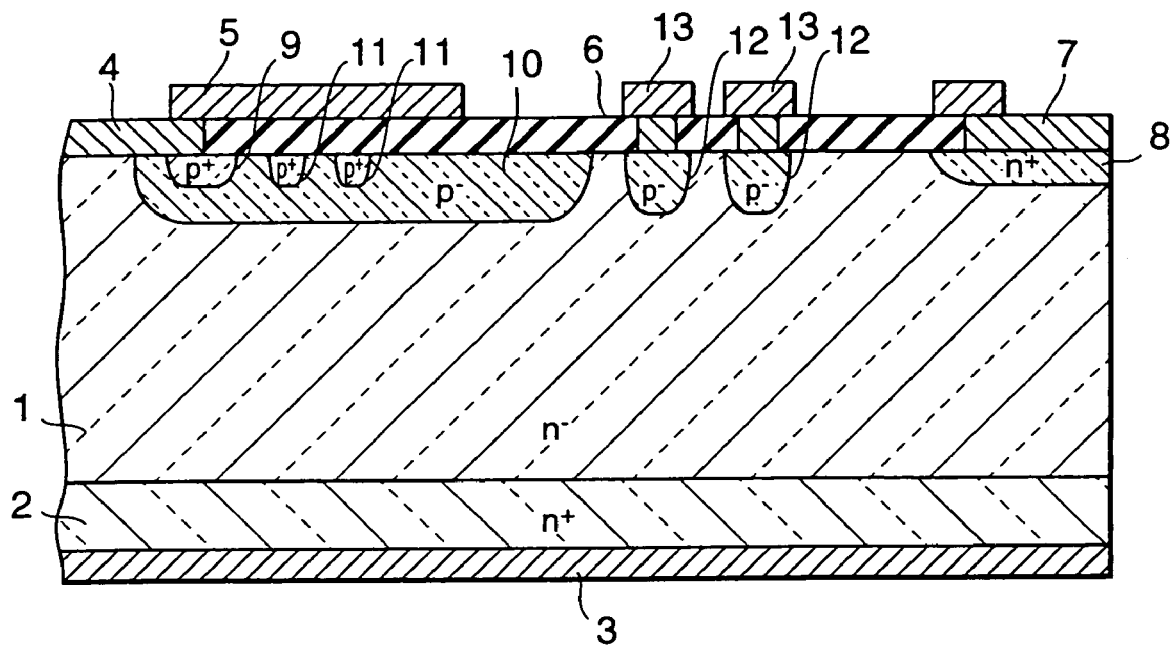
FIG. 13 is a schematic cross sectional view of still another high withstand voltage semiconductor device obtained by modifying the first embodiment.

FIG. 13 schematically illustrates still another high withstand voltage semiconductor device also obtained by modifying the embodiment of FIG. 1. The high withstand voltage semiconductor device of FIG. 13 differs from that of FIG. 1 in that it additionally comprises sixth electrodes 13 arranged respectively on the outer ring layers 12. Otherwise, the device has a structure same as that of the device of FIG. 1 and hence will not be described any further. This structure provides advantages same as those of the embodiment of FIG. 1.

Figure 14:
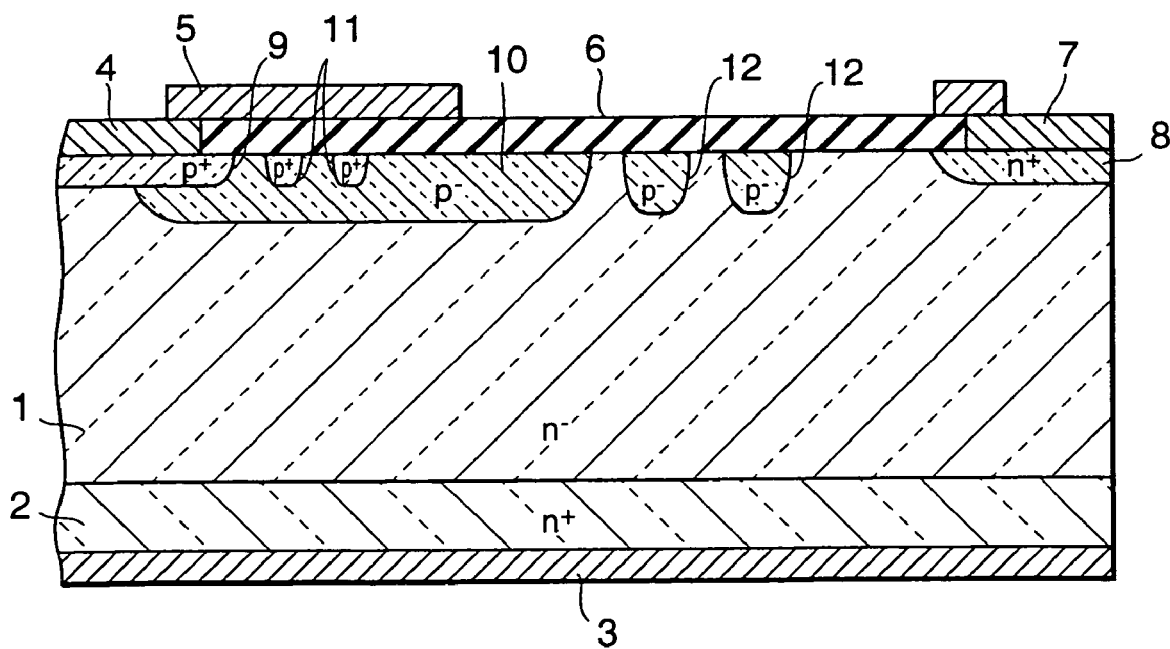
FIG. 14 is a schematic cross sectional view of still another high withstand voltage semiconductor device obtained by modifying the first embodiment.

FIG. 14 schematically illustrates still another high withstand voltage semiconductor device also obtained by modifying the embodiment of FIG. 1. The high withstand voltage semiconductor device of FIG. 14 differs from that of FIG. 1 in that the edge termination layer 9 extends beyond the RESURF layer 10 and is held in ohmic contact with the first electrode 4. This structure provides a PN junction diode. Otherwise, the device has a structure same as that of the device of FIG. 1 and hence will not be described any further. This structure provides advantages same as those of the embodiment of FIG. 1.

A structure obtained by inverting the type of impurity from the p type to the n type or vice versa can also be provided within the scope of the invention. Similarly, semiconductor other than SiC can also be used for the purpose of the invention. For instance, Si semiconductor can feasibly be used for the purpose of the invention. The optimal concentration of the RESURF layer 10 is lower than that of a device using 4H—SiC by a magnitude of a digit. However, the withstand voltage can be reliably maintained at or near the optimal level due to the termination structure of the present invention.

Figure 15:
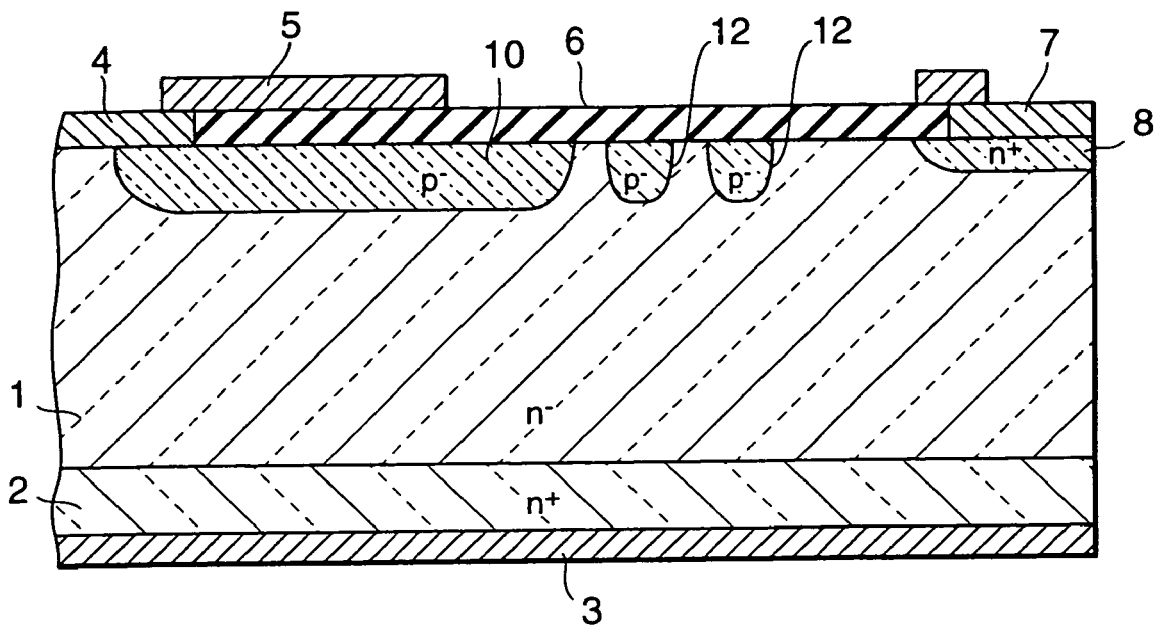
FIG. 15 is a schematic cross sectional view of part of the second embodiment of high withstand voltage semiconductor device according to the invention.

FIG. 15 is a schematic cross sectional view of another embodiment of high withstand voltage semiconductor device (Schottky barrier diode) according to the invention. This embodiment is realized by using a 4H—SiC substrate and shows a circular structure that is centered at the first electrode 4.

As shown in FIG. 15, the embodiment comprises an n-type semiconductor layer 1, on the rear surface of which an n+ type semiconductor layer 2 is formed, and a RESURF layer 10, which is a p- type low impurity concentration layer, formed on the front surface of the n- type semiconductor layer 1.

Two outer ring layers 12, which are p- type low impurity concentration layers, are arranged around the outer periphery of the RESURF layer 10 on the front surface of the n- type semiconductor layer. The impurity concentration of the outer ring layers 12 is substantially same as that of the RESURF layer 10.

The first electrode 4 is arranged as Schottky electrode on the n- type semiconductor layer 1 and the RESURF layer 10. A field plate layer 5 is formed on and electrically connected to the first electrode 4. The field plate layer 5 is also found above the n- type semiconductor layer 1 with an insulating film 6 interposed between them. An end of the field plate layer 5 is located above the RESURF layer 10. The field plate layer 5 having such a configuration provides an effect of alleviating convergence of electric field to an end of the electrode and suppress any possible fall of withstand voltage.

There is an optimal impurity concentration for the RESURF layer 10 and the withstand voltage falls rapidly when the concentration falls from the optimal level. On the other hand, the fall of the withstand voltage is not so remarkable when the concentration exceeds the optimal level. The RESURF layer 10 is produced by ion implantation and the impurity concentration of the RESURF layer 10 is controlled by controlling the dose of impurity. When these factors are taken into consideration, it will be appreciated that the optimal concentration zone for a dose that can provide a withstand voltage higher than 800V is between $0.8 \times 10^{13}$ cm$^{-2}$ and $1 \times 10^{14}$ cm$^{-2}$. Note that this optimal concentration zone is applicable to a device formed by using 4H—SiC (silicon carbide) as semiconductor.

The dose level becomes short of the optimal level because the implanted ions will be partly lost as a result of external dispersion of impurity atoms and surface etching that can take place during the manufacturing process. In consideration of such loss, the dose needs to be selected so that the dose level may not be smaller than the optimal level of the RESURF layer. Therefore, an amount greater than the designed optimal level, e.g., $1.5 \times 10^{13}$ cm$^{-3}$, may preferably be selected.

A second electrode 3 is formed below the rear surface of the n- type semiconductor layer 1 with the n+ type semiconductor layer 2 arranged between them. A channel stopper region 8, which is an n+ high impurity concentration layer, is formed around the outer ring layers 12 on the front surface of the n- type semiconductor layer 1. A third electrode 7 is formed on the channel stopper region 8 and electrically connected to the second electrode 3. The channel stopper region 8 prevents a channel from expanding outside the device.

With the structure of FIG. 15, the semiconductor device shows a high withstand voltage because the withstand voltage is not reduced if the impurity concentration of the RESURF layer 10 exceed the optimal level. Preferably, the ratio of the concentration of the RESURF layer 10 to that of the outer ring layers 12 is between 1 to 0.5 and 1 to 2.

This embodiment provides an advantage that the semiconductor device is made to show a predetermined withstand voltage by selecting a concentration level higher than the designed optimal level for the actual manufacturing process if the impurity dose is subject to variance. Thus, it is possible to manufacture high quality devices.

Figure 16:
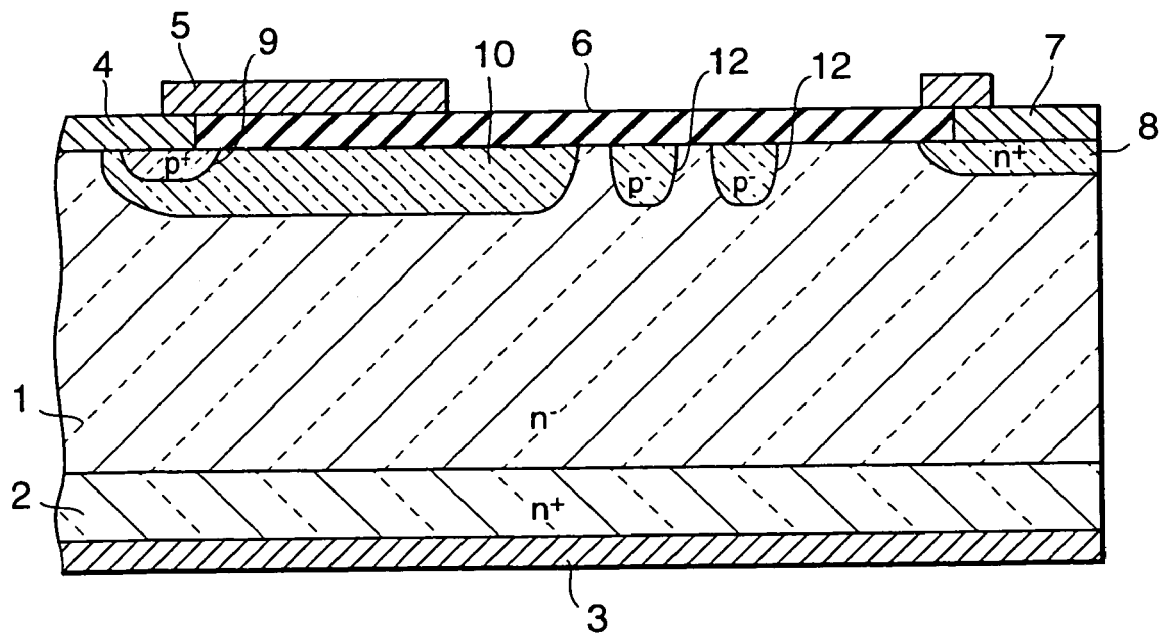
FIG. 16 is a schematic cross sectional view of a high withstand voltage semiconductor device obtained by modifying the second embodiment.

FIG. 16 schematically illustrates a high withstand voltage semiconductor device (Schottky barrier diode) obtained by modifying the embodiment of FIG. 15. The device of FIG. 16 is formed also by using a 4H—SiC substrate.

As shown in FIG. 16, the Schottky barrier diode comprises an n- type semiconductor layer 1, on the rear surface of which an n+ type semiconductor layer 2 is formed, and an edge termination layer 9, which is a p+ type high impurity concentration layer, formed on the front surface of the n- type semiconductor layer Additionally, a RESURF layer 10, which is a p- type low impurity concentration layer, is formed on the front surface of the n- type semiconductor layer 1 so as to contain the edge termination layer 9 in the inside. The impurity concentration of the RESURF layer 10 is lower than that of the edge termination layer 9.

Outer ring layers 12, which are p– type low impurity concentration layers, are arranged around the outer periphery of the RESURF layer 10 on the front surface of the n– type semiconductor layer. The impurity concentration of the outer ring layers 12 is substantially same as that of the RESURF layer 10.

A first electrode 4 is arranged on the n– type semiconductor layer 1. A field plate layer 5 is formed on and electrically connected to the first electrode 4. The field plate layer 5 is also found above the n– type semiconductor layer 1 with an insulating film 6 interposed between them. An end of the field plate layer 5 is located above the RESURF layer 10. The field plate layer 5 having such a configuration provides an effect of alleviating convergence of electric field to an end of the electrode and suppress any possible fall of withstand voltage.

There is an optimal impurity concentration for the RESURF layer 10 and the withstand voltage falls rapidly when the concentration falls from the optimal level. On the other hand, the fall of the withstand voltage is not so remarkable when the concentration exceeds the optimal level. The RESURF layer 10 is produced by ion implantation and the impurity concentration of the RESURF layer 10 is controlled by controlling the dose of impurity. The dose may typically be $1 \times 10^{13}$ cm$^{-2}$.

The dose level becomes short of the optimal level because the implanted ions will be partly lost as a result of external dispersion of impurity atoms and surface etching that can take place during the manufacturing process. In consideration of such loss, the dose needs to be selected so that the dose level may not be smaller than the optimal level of the RESURF layer. Therefore, an amount greater than the designed optimal level, e.g., $1.5 \times 10^{13}$ cm$^{-3}$, may preferably be selected.

A second electrode 3 is formed below the rear surface of the n– type semiconductor layer 1 with the n+ type semiconductor layer 2 arranged between them. A channel stopper region 8, which is an n+ high impurity concentration layer, is formed around the outer ring layers 12 on the front surface of the n– type semiconductor layer 1. A third electrode 7 is formed on the channel stopper region 8 and electrically connected to the second electrode 3. The channel stopper region 8 prevents a channel from expanding outside the device.

This high withstand voltage semiconductor device has a circular structure that is centered at the first electrode 4.

With the structure of FIG. 16, the semiconductor device shows a high withstand voltage because the withstand voltage is not reduced if the impurity concentration of the RESURF layer 10 exceeds the optimal level. Preferably, the ratio of the concentration of the RESURF layer 10 to that of the outer ring layers 12 is between 1 to 0.5 and 1 to 2.

Figure 17:
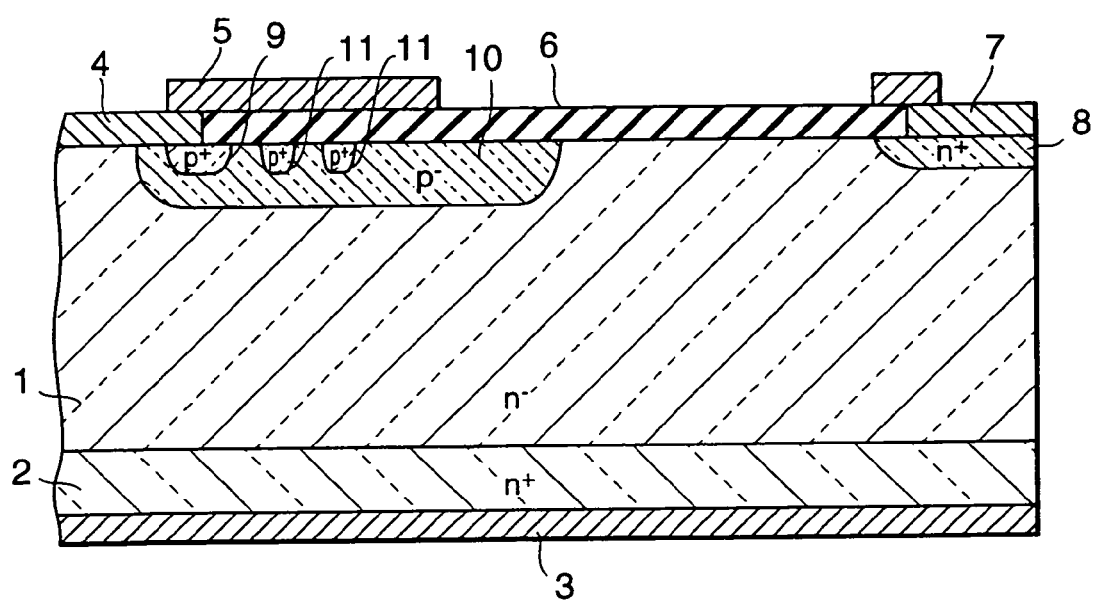
FIG. 17 is a schematic cross sectional view of part of the third embodiment of high withstand voltage semiconductor device according to the invention.

FIG. 17 is a schematic cross sectional view of still another embodiment of high withstand voltage semiconductor device (Schottky barrier diode). The device of FIG. 17 is formed also by using a 4H—SiC substrate and shows a circular structure that is centered at the first electrode 4.

As shown in FIG. 17, the Schottky barrier diode comprises an n– type semiconductor layer 1, on the rear surface of which an n+ type semiconductor layer 2 is formed, and an edge termination layer 9, which is a p+ type high impurity concentration layer, formed on the front surface of the n– type semiconductor layer 1.

Additionally, a RESURF layer 10, which is a p– type low impurity concentration layer, is formed on the front surface of the n– type semiconductor layer 1 so as to contain the edge termination layer 9 in the inside. The impurity concentration of the RESURF layer 10 is lower than that of the edge termination layer 9.

Inner ring layers 11, which are p+ type high impurity concentration layers, are arranged around the outer periphery of the edge termination layer 9 on the front surface of the n– type semiconductor layer. The impurity concentration of the inner ring layers 11 is substantially same as that of the edge termination layer 9.

A first electrode 4 is arranged on the edge termination layer 9. A field plate layer 5 is formed on and electrically connected to the first electrode 4. The field plate layer 5 is also found above the n– type semiconductor layer 1 with an insulating film 6 interposed between them. An end of the field plate layer 5 is located above the RESURF layer 10. The field plate layer 5 having such a configuration provides an effect of alleviating convergence of electric field to an end of the electrode and suppress any possible fall of withstand voltage.

There is an optimal impurity concentration for the RESURF layer 10 and the withstand voltage falls rapidly when the concentration falls from the optimal level. On the other hand, the fall of the withstand voltage is not so remarkable when the concentration exceeds the optimal level. The RESURF layer 10 is produced by ion implantation and the impurity concentration of the RESURF layer 10 is controlled by controlling the dose of impurity. The dose may typically be $1 \times 10^{13}$ cm$^{-2}$.

The dose level becomes short of the optimal level because the implanted ions will be partly lost as a result of external dispersion of impurity atoms and surface etching that can take place during the manufacturing process. In consideration of such loss, the dose needs to be selected so that the dose level may not be greater than the optimal level of the RESURF layer. For example, an amount of $0.7 \times 10^{13}$ cm$^{-3}$ may preferably be selected.

A second electrode 3 is formed below the rear surface of the n– type semiconductor layer 1 with the n+ type semiconductor layer 2 arranged between them. A channel stopper region 8, which is an n+ high impurity concentration layer, is formed around the RESURF layers 10 on the front surface of the n– type semiconductor layer 1. A third electrode 7 is formed on the channel stopper region 8 and electrically connected to the second electrode 3. The channel stopper region 8 prevents a channel from expanding outside the device.

This high withstand voltage semiconductor device has a circular structure that is centered at the first electrode 4.

With the structure of this embodiment of high withstand voltage semiconductor device shows a high withstand voltage because the withstand voltage is not reduced if the impurity concentration of the RESURF layer 10 becomes short of the optimal level. Preferably, the ratio of the concentration of the RESURF layer 10 to that of the outer ring layers 12 is between 1 to 0.5 and 1 to 2.

Figure 18:
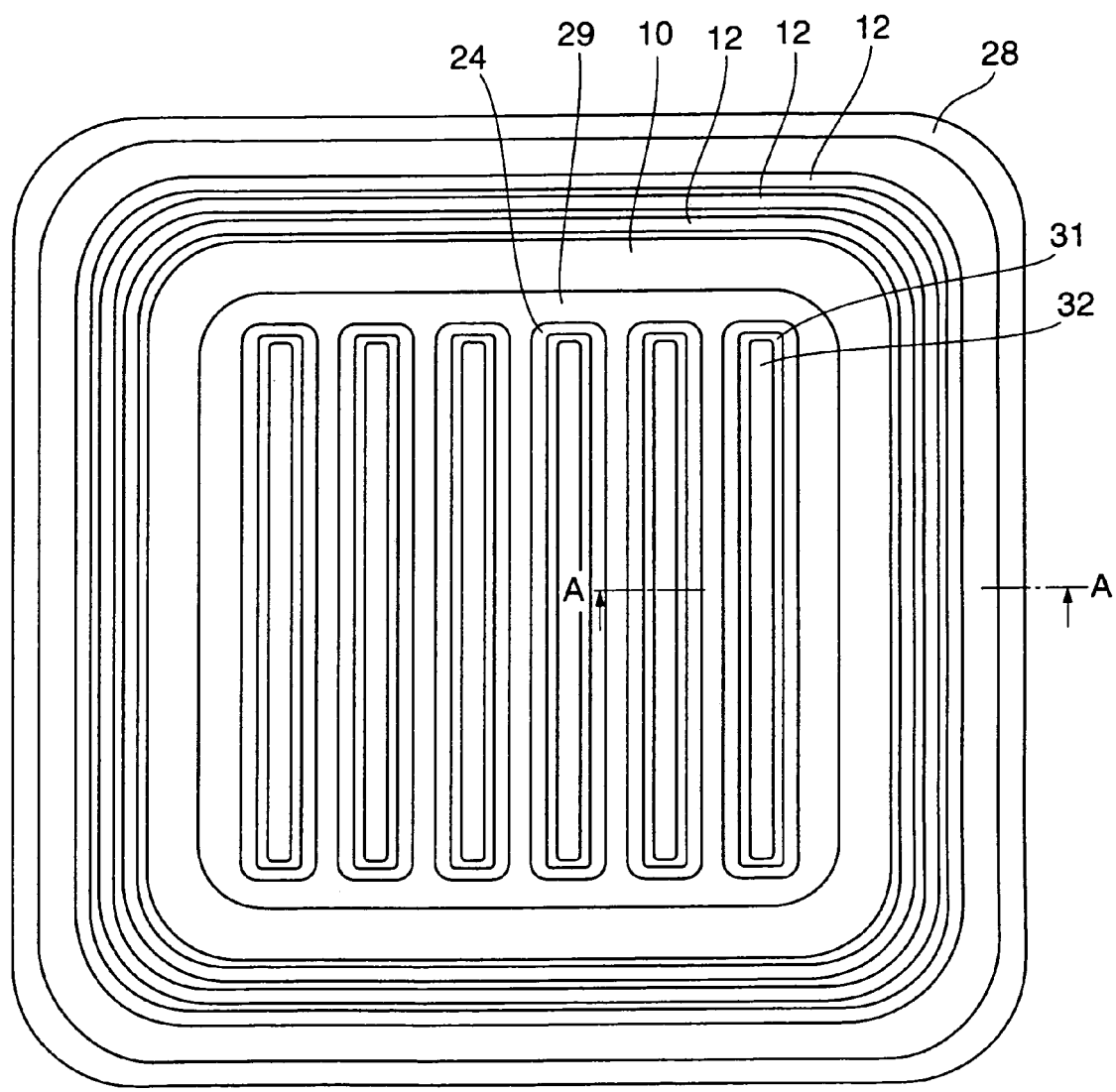
FIG. 18 is a schematic plan view of the fourth embodiment of high withstand voltage semiconductor device according to the invention.
Figure 19:
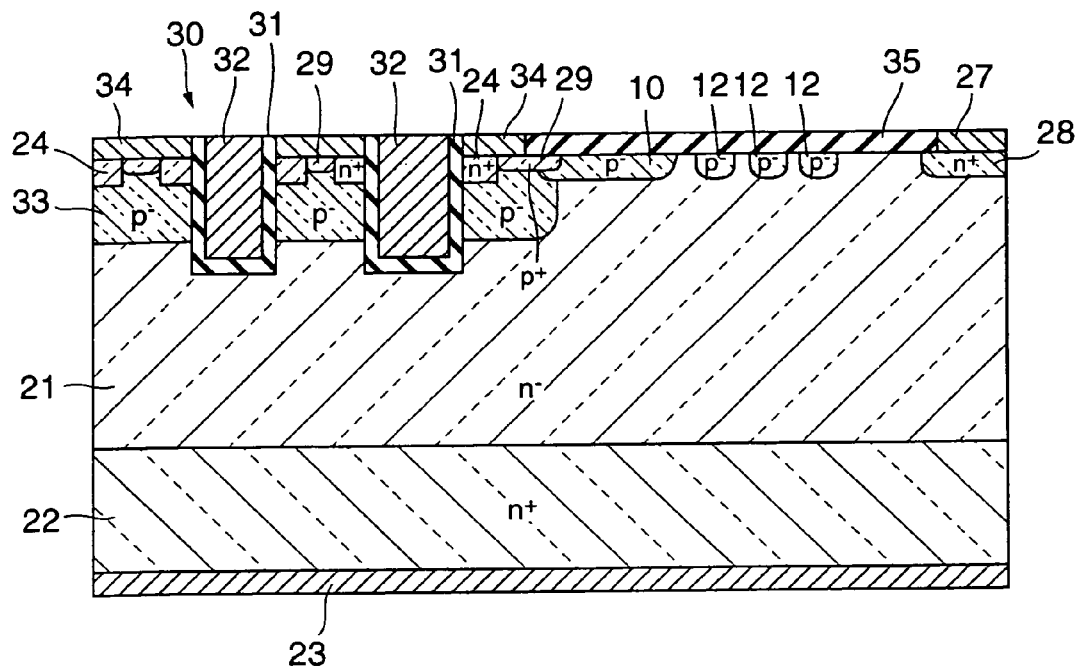
FIG. 19 is a schematic cross sectional view of part of the fourth embodiment taken along line A—A in FIG. 18.
Figure 20:
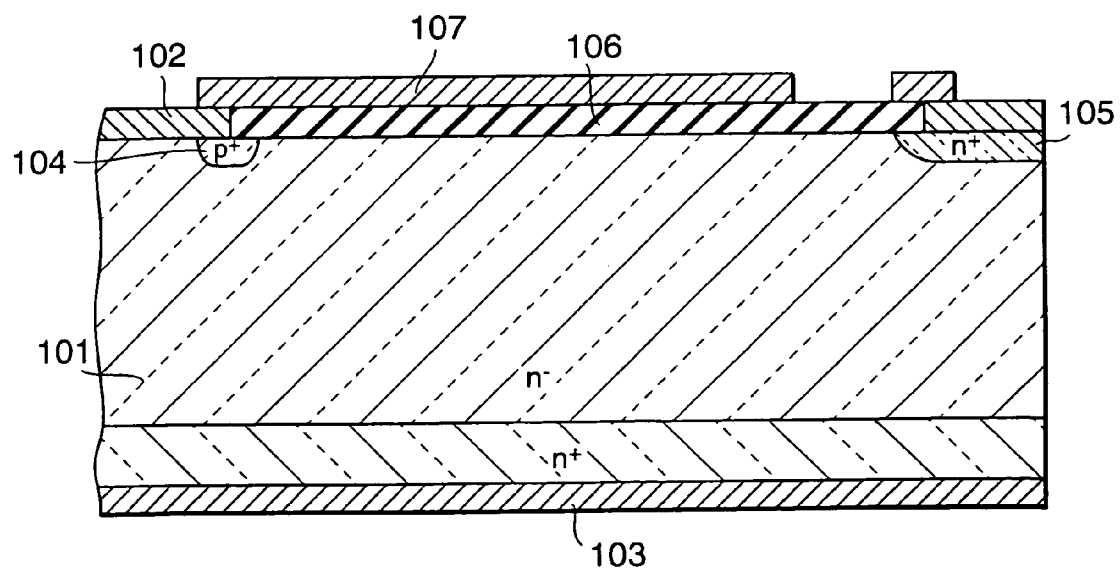
FIG. 20 is a schematic cross sectional view of a known field plate withstand voltage structure.
Figure 21:
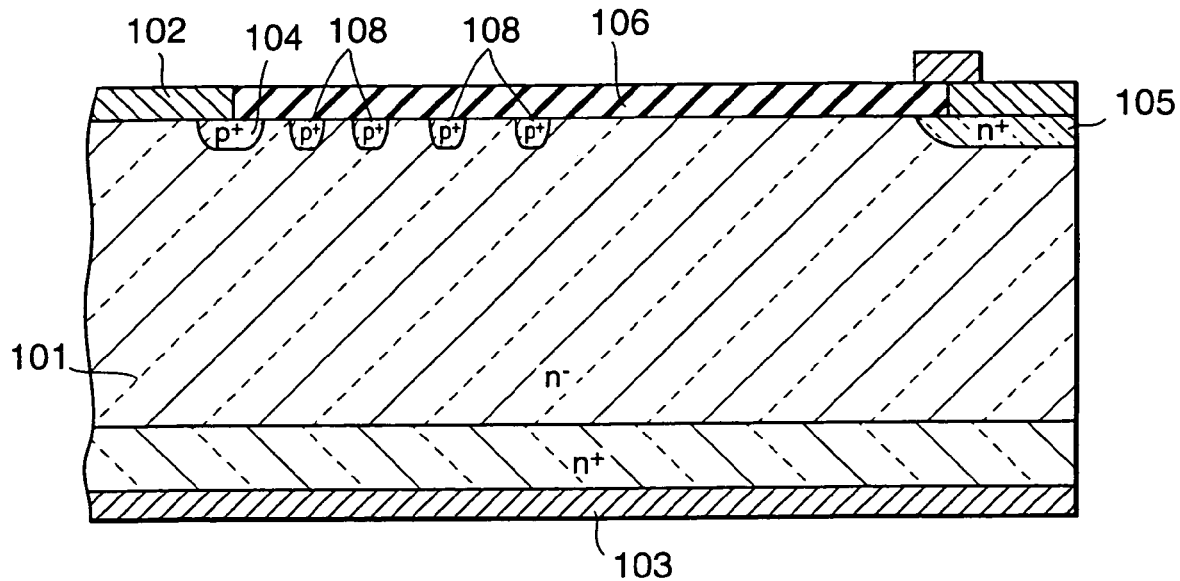
FIG. 21 is a schematic cross sectional view of a known guard ring withstand voltage structure.

FIGS. 18 and 19 schematically illustrate still another embodiment of high withstand voltage semiconductor device (MOSFET). More than one MOSFETs are shown in FIGS. 18 and 19. The devices of FIGS. 18 and 19 are formed also by using a 4H—SiC substrate whose corners are rounded. FIG. 18 is a schematic plan view of the MOSFETS, although the electrodes are not shown for the purpose of simplicity. FIG. 19 is a schematic cross sectional view of part of the devices including the electrodes.

As seen from 19, the MOSFETs 30 are formed at the center of the front surface of an n– type semiconductor layer 21, on the rear surface of which an n+ type semiconductor layer 2 is formed, and surrounded by a terminating region. A number of trenches are formed on the surface of the semiconductor layer 22 and a gate $SiO_2$ film 31 is formed on the inner wall of each of the trenches. A metal gate electrode 32 is buried in each trench. A P− type low impurity concentration layer 33 is formed to surround each gate electrode. The layer 33 has a low profile if compared with the trench. Then, for each device, a source region 24, which is an n+ type semiconductor layer and has a low profile, is formed on the surface of the semiconductor layer so as to surround the gate oxide film 31. An edge termination layer 29 is formed on the semiconductor layer and located adjacently relative to the source region 24. Then, a source electrode 34, which is made of metal film, is arranged in such away that it bridges the source region 24 and the edge termination layer 29 and contacts them.

The edge termination layer 29 is formed to show a pattern of surrounding the MOSFET. Then, a RESURF layer 10, which is a p− type low impurity concentration layer, is arranged around and held in contact with the outermost edge termination layer 29. Three outer ring layers 12 are arranged concentrically outside the RESURF layer. They are separated from the RESURF layer and from each other. The impurity concentration of the outer ring layers 12 is substantially same as that of the RESURF layer 10. Preferably, the ratio of the concentration of the RESURF layer 10 to that of the outer ring layers 12 is between 1 to 0.5 and 1 to 2.

A channel stopper region 28 is formed at the outermost end of the front surface of the semiconductor layer 31 and then an electrode 27 is arranged on the surface of the channel stopper region 28. The channel stopper region 8 prevents a channel from expanding outside the device.

In FIG. 19, reference symbol 35 denotes an insulating film. A drain region 22, which is a n+ type high impurity concentration layer, is formed on the rear surface of the semiconductor layer 21 and a drain electrode 23 is connected to the drain region 22.

Te above described structure provides an advantage that the semiconductor device is made to substantially show the highest withstand voltage that the RESURF layer can achieve by selecting for the RESURF layer an impurity concentration level higher than the designed optimal level for the actual manufacturing process if the impurity dose is subject to variance.

The present invention is applicable not only to diode structures and MOSFETs as described above but also to other high withstand voltage semiconductor devices such as IGBTs and thyristors in order to provide them with a termination structure.

As described above in detail, the present invention makes it possible to provide a high withstand voltage semiconductor device that can be prevented from degradation of withstand voltage if dimensional variances are involved in the manufacturing process due to a displaced mask and/or a variance of impurity concentration. The present invention is by no means limited to the above described embodiments, which may be modified or altered appropriately without departing from the scope of the invention.

What is claimed is:

1. A semiconductor device comprising:
   a semiconductor layer of a first conductivity type;
   a first electrode formed on a part of a front surface of said semiconductor layer;
   a second electrode formed on a rear surface of said semiconductor layer;
   a first low impurity concentration semiconductor region of a second conductivity type formed on said front surface of said semiconductor layer; and
   a second low impurity concentration semiconductor region of the second conductivity type formed on said front surface of said semiconductor layer and arranged so as to surround said first low impurity concentration semiconductor region, wherein
   said first low impurity concentration semiconductor region having a width not smaller than a largest value of a depletion layer that expands at a time of application of a high voltage to break down said first conductivity type semiconductor layer (as expressed by Emax*eps/q*Nd), the largest breakdown electric field, the dielectric constant of the semiconductor, the unit electric charge and an impurity concentration of the semiconductor layer being Emax (V/m), eps (F/m), q(C) and Nd(1/m3) respectively).

2. A device according to claim 1, wherein said semiconductor layer is made of SiC(silicon carbide).

3. A device according to claim 2, wherein the dose of said first low impurity concentration semiconductor region is not lower than $8\times10^{12}$ cm$^{-2}$ and not higher than $1\times10^{14}$ cm$^{-2}$.

4. The device according to claim 3, wherein
   a ratio of the dose of said first low impurity concentration semiconductor region to that of said second low impurity concentration semiconductor region is between 1 to 0.5 and 1 to 2.

5. The device according to claim 1, wherein
   said second low impurity concentration semiconductor region is arranged so as to surround said first low impurity concentration semiconductor region with a gap therebetween.

6. A semiconductor device comprising:
   a semiconductor layer of a first conductivity type;
   a first electrode formed on a part of a front surface of said semiconductor layer;
   a second electrode formed on a rear surface of said semiconductor layer;
   a first low impurity concentration semiconductor region of a second conductivity type formed on said front surface of said semiconductor layer; and
   a second low impurity concentration semiconductor region of the second conductivity type formed on said front surface of said semiconductor layer and arranged so as to surround said first low impurity concentration semiconductor region, wherein
   a dose of said first low impurity concentration semiconductor region is in a range from 0.8 to 10 times of a dose for completely depleting said first low impurity concentration semiconductor region (as expressed by Emax*eps/q, when a largest breakdown electric field is Emax (V/m), a dielectric constant of the semiconductor layer is eps (F/m) and a unit electric charge is q (C)) when a reverse voltage for producing the largest breakdown electric field at ajunction of said first low impurity concentration semiconductor region and said semiconductor layer is applied to said device.

7. A semiconductor device comprising:
   a semiconductor layer of a first conductivity type;
   a first electrode formed on a part of a front surface of said semiconductor layer;
   a second electrode formed on a rear surface of said semiconductor layer;
   a first low impurity concentration semiconductor region of a second conductivity type formed on said front surface of said semiconductor layer; and a second low impurity concentration semiconductor region of the second conductivity type formed on said front surface of said semiconductor layer and arranged so as to surround said first low impurity concentration semiconductor region, wherein said second low impurity concentration semiconductor region is positioned to share an electric field applied to said first low impurity concentration semiconductor region, if the dose of said first low impurity concentration semiconductor region is not smaller than the dose for completely depleting said first low impurity concentration semiconductor region (as expressed by Emax*eps/q, when the largest breakdown electric field is Emax (V/m), the dielectric constant of the semiconductor is eps (F/m) and the unit electric charge is q (C)) when the reverse voltage for producing the largest breakdown electric field at a junction of said first low impurity concentration semiconductor region and said semiconductor layer is applied to said device.

8. A semiconductor device comprising:
a semiconductor layer of a first conductivity type;
a first electrode formed on a part of a front surface of said semiconductor layer;
a second electrode formed on a rear surface of said semiconductor layer;
a RESURF layer of a low impurity concentration semiconductor region of a second conductivity type formed on said front surface of said semiconductor layer; and
an outer ring region of a low impurity concentration of the second conductivity type formed on said front surface of said semiconductor layer and arranged so as to surround said RESURF layer,
wherein said first low impurity concentration semiconductor region having a width no smaller than a largest value of a depletion layer that expands at a time of application of a high voltage to break down said first conductivity type semiconductor layer (as expressed by Emax*eps/q*Nd), the largest breakdown electric field, the dielectric constant of the semiconductor, the unit electric charge and an impurity concentration of the semiconductor layer being Emax (V/m), eps (F/m), q(C) and Nd(1/m3) respectively).

9. The device according to claim 8, wherein said outer ring region is arranged so as to surround said RESURF layer.

10. The device according to claim 8, wherein said semiconductor layer is made of SiC(silicon carbide).

11. The device according to claim 10, wherein the dose of said first low impurity concentration semiconductor region is not lower than $8\times10^{12}$ cm$^{-2}$ and not higher than $1\times10^{14}$ cm$^{-2}$.

12. The device according to claim 11, wherein a ratio of the dose of said first low impurity concentration semiconductor region to that of said second low impurity concentration semiconductor region is between 1 to 0.5 and 1 to 2.

13. A semiconductor device comprising:
a semiconductor layer of a first conductivity type;
a first electrode formed on a part of a front surface of said semiconductor layer;
a second electrode formed on a rear surface of said semiconductor layer;
a RESURF layer of a low impurity concentration semiconductor region of a second conductivity type formed on said front surface of said semiconductor layer; and
an outer ring region of a low impurity concentration of the second conductivity type formed on said front surface of said semiconductor layer and arranged so as to surround said RESURF layer, wherein
a dose of said first RESURF layer is in a range from 0.8 to 10 times of a dose for completely depleting said RESURF layer (as expressed by Emax*eps/q, when a largest breakdown electric field is Emax (V/m), a dielectric constant of the semiconductor layer is eps (F/m) and a unit electric charge is q (C)) when a reverse voltage for producing the largest breakdown electric field at a junction of said RESURF layer and said semiconductor layer is applied to said device.

14. A semiconductor device comprising:
a semiconductor layer of a first conductivity type;
a first electrode formed on a part of a front surface of said semiconductor layer;
a second electrode formed on a rear surface of said semiconductor layer;
a RESURF layer of a low impurity concentration semiconductor region of a second conductivity type formed on said front surface of said semiconductor layer; and
an outer ring region of a low impurity concentration of the second conductivity type formed on said front surface of said semiconductor layer and arranged so as to surround said RESURF layer, wherein
said outer ring region is positioned to share an electric field applied to said RESURF layer, if the dose of said RESURF layer is not smaller than the dose for completely depleting said RESURF layer (as expressed by Emax*eps/q, when the largest breakdown electric field is Emax (V/m), the dielectric constant of the semiconductor is eps (F/m) and the unit electric charge is q (C)) when the reverse voltage for producing the largest breakdown electric field at the junction of said RESURF layer and said semiconductor layer is applied to said device.

* * * * *